(12) United States Patent
Noguchi

(10) Patent No.: US 7,352,063 B2
(45) Date of Patent: Apr. 1, 2008

(54) SEMICONDUCTOR STRUCTURE THAT INCLUDES A COOLING STRUCTURE FORMED ON A SEMICONDUCTOR SURFACE AND METHOD OF MANUFACTURING THE SAME

(75) Inventor: Takashi Noguchi, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 407 days.

(21) Appl. No.: 11/152,225

(22) Filed: Jun. 15, 2005

(65) Prior Publication Data
US 2006/0012033 A1    Jan. 19, 2006

(30) Foreign Application Priority Data
Jul. 13, 2004    (JP)    ............... 2004-205692

(51) Int. Cl.
*H01L 23/38*    (2006.01)
*H01L 21/50*    (2006.01)

(52) U.S. Cl. ............... 257/707; 257/713; 257/E23.082; 438/122; 438/667

(58) Field of Classification Search ......... 257/E23.082
See application file for complete search history.

(56) References Cited

U.S. PATENT DOCUMENTS 5,874,775 A * 2/1999 Shiomi et al. ............ 257/712
6,281,120 B1 * 8/2001 Strnad ........................ 438/660
6,627,988 B2   9/2003 Andoh
6,711,904 B1 * 3/2004 Law et al. ................... 62/3.2
2006/0097383 A1 * 5/2006 Ramanathan et al. ....... 257/712

FOREIGN PATENT DOCUMENTS

JP    2003-17638    1/2003

* cited by examiner

*Primary Examiner*—Stephen W. Smoot
(74) *Attorney, Agent, or Firm*—Volentine & Whitt, P.L.L.C.

(57) ABSTRACT

A semiconductor device has a semiconductor chip having first and second surfaces; a sealing resin formed over the first surface; and a cooling structure having a first conductive layer formed on the first surface, an n-type semiconductor formed on the first conductive layer and having one end thereof being exposed from the sealing resin, a p-type semiconductor formed on the first conductive layer and having one end thereof being exposed from the sealing resin, a second conductive layer contacting the exposed end of the n-type semiconductor, a third conductive layer contacting the exposed end of the p-type semiconductor, a first electrode pad integrally formed with the second conductive layer, a second electrode pad integrally formed with the third conductive layer, and spherical electrodes formed at the first and second electrode pads, respectively.

52 Claims, 44 Drawing Sheets

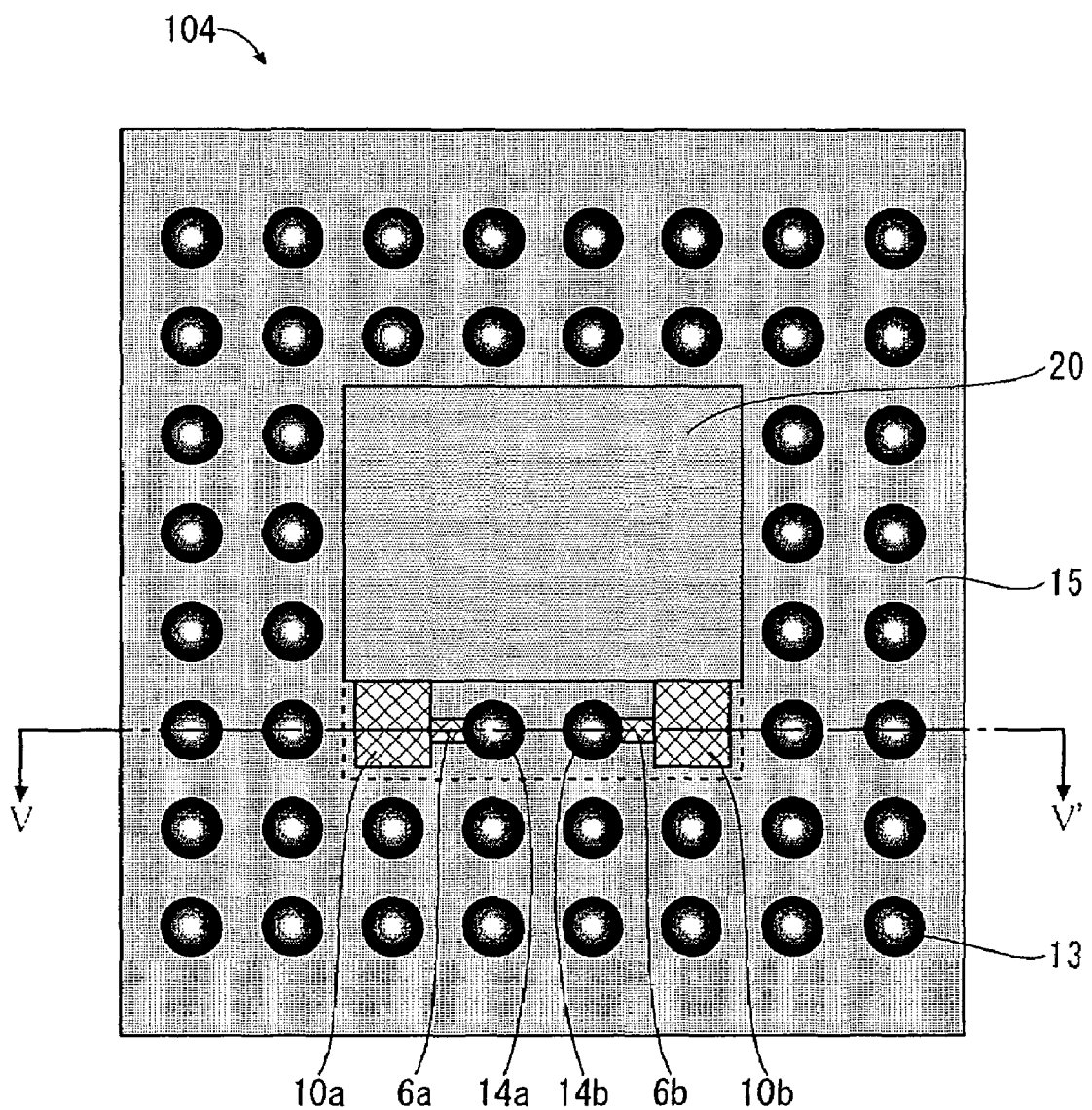

SEMICONDUCTOR STRUCTURE THAT INCLUDES A COOLING STRUCTURE FORMED ON A SEMICONDUCTOR SURFACE AND METHOD OF MANUFACTURING THE SAME

BACKGROUND OF THE INVENTION

1. Field of the Invention

The present invention generally relates to a semiconductor device. More specifically, the present invention relates to a chip-size packaged resin-sealed type semiconductor device including a cooling function, and a method of manufacturing the same.

2. Background Information

In recent years, portable devices represented by notebook PCs, cellular phones, etc. have rapidly become popular, and there are growing demands for much smaller, thinner, and lighter semiconductor devices to be mounted on such portable devices. One key technology which complies with such demands is a high-density packaging technology which includes a CSP (chip size package) and so forth. According to the CSP, the package size can be brought infinitely close to the size of a semiconductor chip. In particular, a W-CSP (wafer level chip size package) is attracting special attention as a product that realizes an ultimate compact package. In the W-CSP, the sealing/molding process is done at a wafer level, and thus the W-CSP is expected to be an effective measure for reducing production costs.

With respect to a high-density packaging technology including the W-CSP, it is necessary to cool the semiconductor chip efficiently without affecting the miniaturization concept that is the essential feature in the high-density packaging technology. For example, a semiconductor device having a cooling function is disclosed in Japanese Patent Application Laid Open No. 2001-291793, pp. 3-4, FIGS. 2 and 3, and Japanese Patent Application Laid Open No. 2003-17638, pp. 3-4, FIG. 1. Japanese Patent Application Laid Open No. 2001-291793 and 2003-17638 are hereby incorporated by reference The semiconductor device as disclosed in Japanese Patent Application Laid Open No. 2001-291793 has a metal radiating material (i.e. cooling post) provided inside a sealing resin of a CSP, whereby the heat generated from the semiconductor chip can be released naturally through the radiating material.

The semiconductor device as disclosed in Japanese Patent Application Laid Open No. 2003-17638 is a stack type MCP (multi chip package) where a number of semiconductor substrates are stacked to be mounted on a single package. In this stack type MCP, one or more Peltier elements, which are radiating materials, are stacked along with the semiconductor substrates in order to control heat conduction among the substrates. Thereby, even with a laminating structure of a number of semiconductor substrates having different junction temperatures, all the semiconductor substrates can be cooled efficiently.

With respect to high-density packaging technology such as the W-CSP or the like, a part of a semiconductor chip, for example the back surface of the semiconductor chip where a semiconductor element is not formed, is likely to be exposed to air in most cases. The thermal emissivity of silicon exposed to air is about 0.038. This is considerably low compared to the thermal emissivity 0.93 of silicon being sealed in a usual mold package. From here onwards, it is difficult for silicon by itself to radiate heat. However, adopting an external heat radiation fin as in the conventional cases in order to resolve such problems is contrary to the miniaturization concept that is the original purpose in the production of high-density packaging technology, and is not ideal.

The semiconductor device as disclosed in Japanese Patent Application Laid Open No. 2001-291793 radiates heat through the metal radiating material provided inside the sealing resin under a natural convection environment. Therefore, in order to improve the cooling efficiency, it is necessary to enlarge the size of the radiating material. Considering this point, it is difficult to have a semiconductor chip that consumes a great amount of power mounted on the semiconductor device.

The semiconductor device as disclosed in Japanese Patent Application Laid Open No. 2003-17638 forcibly cools down by using the Peltier elements, and therefore, it exhibits better cooling efficiency when compared with the semiconductor device of Japanese Patent Application Laid Open No. 2001-291793. However, in attaching separate Peltier elements to the surface of the semiconductor chip, there is a possibility that air or other particles may enter the junction between the Peltier elements and the semiconductor chip. A layer of such air may prevent conduction of heat, and may deteriorate the heat radiation effect of the Peltier elements.

In view of the above, it will be apparent to those skilled in the art from this disclosure that there exists a need for an improved semiconductor device and an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide an improved semiconductor device that is sealed by a resin and in which a cooling function is incorporated. It is also an object of the present invention to provide an improved method of manufacturing a semiconductor device that is suitable for manufacturing a semiconductor device that is sealed by a resin and in which a cooling function is incorporated.

In accordance with a first aspect of the present invention, a semiconductor device has a semiconductor chip, a sealing resin, and a cooling structure. The sealing resin is formed over the first surface. The cooling structure has a first conductive layer, an n-type semiconductor, a p-type semiconductor, a second conductive layer, a third conductive layer, a first electrode pad, a second electrode pad, and spherical electrodes. The first conductive layer is formed on the first surface. The n-type semiconductor is formed on the first conductive layer and has one end thereof exposed from the sealing resin. The p-type semiconductor is formed on the first conductive layer and has one end thereof exposed from the sealing resin. The second conductive layer contacts the exposed end of the n-type semiconductor. The third conductive layer contacts the exposed end of the p-type semiconductor. The first electrode pad is integrally formed with the second conductive layer. The second electrode pad is integrally formed with the third conductive layer. Further, the spherical electrodes are formed at the first and second electrode pads.

In accordance with a second aspect of the present invention, a semiconductor device has a semiconductor chip, a first sealing resin, a second sealing resin, a first insulation film, a second insulation film, a third insulation film, and a cooling structure. The semiconductor chip has first and second surfaces facing each other, and third and fourth surfaces facing each other and adjoining the first and second surfaces. The first sealing resin is formed over the first surface. The second sealing resin is formed over the second surface. The first insulation film is formed on the second surface. The second insulation film is formed on the third surface. The third insulation film is formed on the fourth surface. The cooling structure has a first conductive layer, an n-type semiconductor, a p-type semiconductor, a second conductive layer, a third conductive layer, first and second electrode pads, a fourth conductive layer, a fifth conductive layer, and spherical electrodes. The first conductive layer is formed on the first insulation film. The n-type semiconductor is formed on the first conductive layer and has one end thereof being exposed from the second sealing resin. The p-type semiconductor is formed on the first conductive layer and has one end thereof exposed from the second sealing resin. The second conductive layer contacts the exposed end of the n-type semiconductor. The third conductive layer contacts the exposed end of the p-type semiconductor. The first and second electrode pads are formed on the first sealing resin. The fourth conductive layer is formed on the second insulation film and electrically connects the second conductive layer and the first electrode pad. The fifth conductive layer is formed on the third insulation film and electrically connects the third conductive layer and the second electrode pad. Further, the spherical electrodes are formed at the first and second electrode pads.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 11A is a plan view of a resin-sealed type semiconductor device according to a fifth preferred embodiment of the present invention;

DETAILED DESCRIPTION OF THE PREFERRED EMBODIMENTS

Figure 1A:
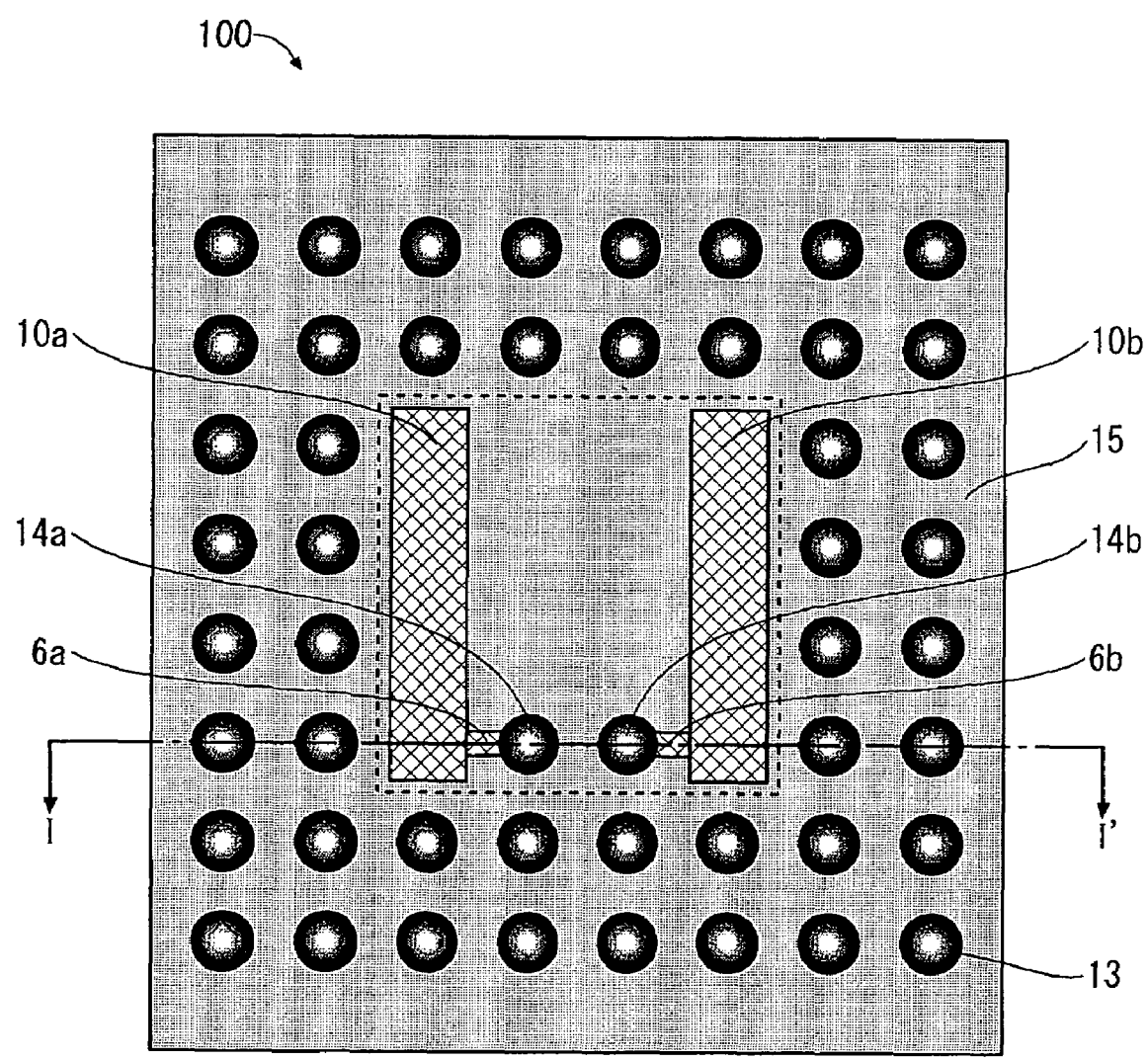
FIG. 1A is a plan view of a resin-sealed type semiconductor device according to a first preferred embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

(1) First Embodiment

Structure

First, a structure of a resin-sealed type semiconductor device 100 according to a first preferred embodiment of the present invention will be explained.

Figure 1B:
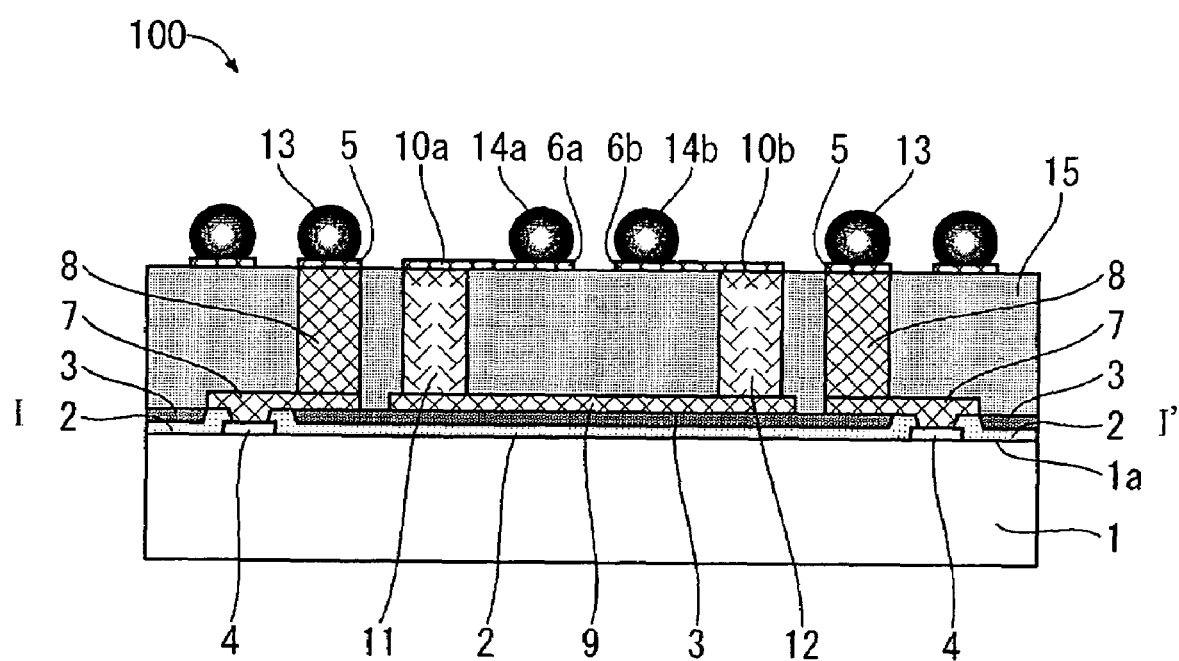
FIG. 1B is a cross-sectional diagrammatical view of the semiconductor device taken along line I-I' shown in FIG. 1A.

FIGS. 1A and 1B are views showing the structure of the resin-sealed type semiconductor device 100 according to the first embodiment of the present invention. FIG. 1A is a plan view of the resin-sealed type semiconductor device 100, and FIG. 1B is a cross-sectional diagrammatical view taken along line I-I' shown in FIG. 1A.

As shown in FIGS. 1A and 1B, the resin-sealed type semiconductor device 100 has a semiconductor chip 1, protective films 2 and 3, electrode pads 4 and 5, an electrode pad 6a (a first electrode pad), an electrode pad 6b (a second electrode pad), re-wiring layers 7, contact portions (i.e. posts) 8, a conductive layer 9 (a first conductive layer), a conductive layer 10a (a second conductive layer), a conductive layer 10b (a third conductive layer), an n-type semiconductor 11, a p-type semiconductor 12, spherical electrodes 13, spherical electrodes 14a and 14b, and a sealing resin 15. It should be noted that the arrangement and the number of the spherical electrodes 13, 14a and 14b are not limited to what is shown in the plan view FIG. 1A and the sectional view FIG. 1B. In addition, the protective films 2 and 3, the electrode pads 4 and 5, and re-wiring layers 7 may be included in the structure of the semiconductor chip 1.

The protective film 2 and the electrode pads 4 are formed on an element formation surface 1a (a first surface) of the semiconductor chip 1. On the element formation surface 1a, an electronic circuitry (not shown) having one or more semiconductor elements such as a transistor is formed. In other words, the semiconductor chip 1 has the electronic circuitry. The protective film 2 is a passivation coating provided to protect the semiconductor chip 1 from possible mechanical stress and entering impurities. The protective film 2 is, for example, a silicon oxide film (SiO2), a silicon nitride film (Si3N4) or the like. The electrode pads 4 are provided to exchange electric signals between the semiconductor chip 1 and the exterior, and are electrically connected with the semiconductor elements (not shown) which are formed on the element formation surface 1a.

The protective film 3 is formed on the semiconductor chip 1 except for the upper parts of the electrode pads 4. In other words, the protective film 3 is formed on the protective film 2, but does not extend over the electrode pads 4. The protective film 3 is, for example, a polyimide resin film. The re-wiring layers 7 are formed on the protective film 3, and are electrically connected with the electrode pads 4, respectively. The contact portions 8 respectively connect the re-wiring layers 7 and the electrode pads 5. For example, the re-wiring layers 7, the contact portions 8 and the electrode pads 5 can be made of metal such as Cu (copper) and Al (aluminum). The spherical electrodes 13 are formed on the electrode pads 5. Further, the spherical electrodes 13 serve as a terminal to connect the resin-sealed type semiconductor device 100 to an external apparatus such as a printed circuit board or the like. Generally, the spherical electrodes 13 are made of solder. In addition, although the cross-sectional diagram of FIG. 1B shows the resin-sealed type semiconductor device 100 having the spherical electrodes 13 arranged in two lines in the outer portion, wirings between the spherical electrodes 13 in the outermost circumference and the semiconductor chip 1 are not shown.

The conductive layer 9 is formed on the protective film 3 at the near center of the semiconductor chip 1. Moreover, the conductive layer 9 is formed such that it is electrically dissociated from the re-wiring layers 7. For example, the conductive layer 9 is preferably made of a metal such as Cu and Al. The n-type semiconductor 11 electrically connects the conductive layer 9 and the conductive layer 10a. On the other hand, the p-type semiconductor 12 electrically connects the conductive layer 9 and the conductive layer 10b. For example, the conductive layers 10a and 10b are preferably made of a metal such as Cu and Al. The electrode pad 6a is integrally formed with the conductive layer 10a. The spherical electrode 14a is formed on the electrode pad 6a. On the other hand, the electrode pad 6b is integrally formed with the conductive layer 10b, and the spherical electrode 14b is formed on the electrode pad 6b. Generally, the spherical electrodes 14a and 14b are solders. In addition, the number of the electrode pad 6a and the spherical electrode 14a with respect to one conductive layer 10a can be pluralized. Similarly, the number of the electrode pad 6b and the spherical electrode 14b with respect to one conductive layer 10b can also be pluralized. The sealing resin 15 seals the protective film 3, the re-wiring layers 7, the contact portions 8, the conductive layer 9, the n-type semiconductor 11, and the p-type semiconductor 12. The sealing resin 15 is, for example, a thermosetting resin such as an epoxy resin.

Cooling Function

Next, a cooling function in the resin-sealed type semiconductor device 100 according to the first embodiment of the present invention will be explained.

The cooling function of the resin-sealed type semiconductor device 100 preferably uses the Peltier effect.

Figure 2:
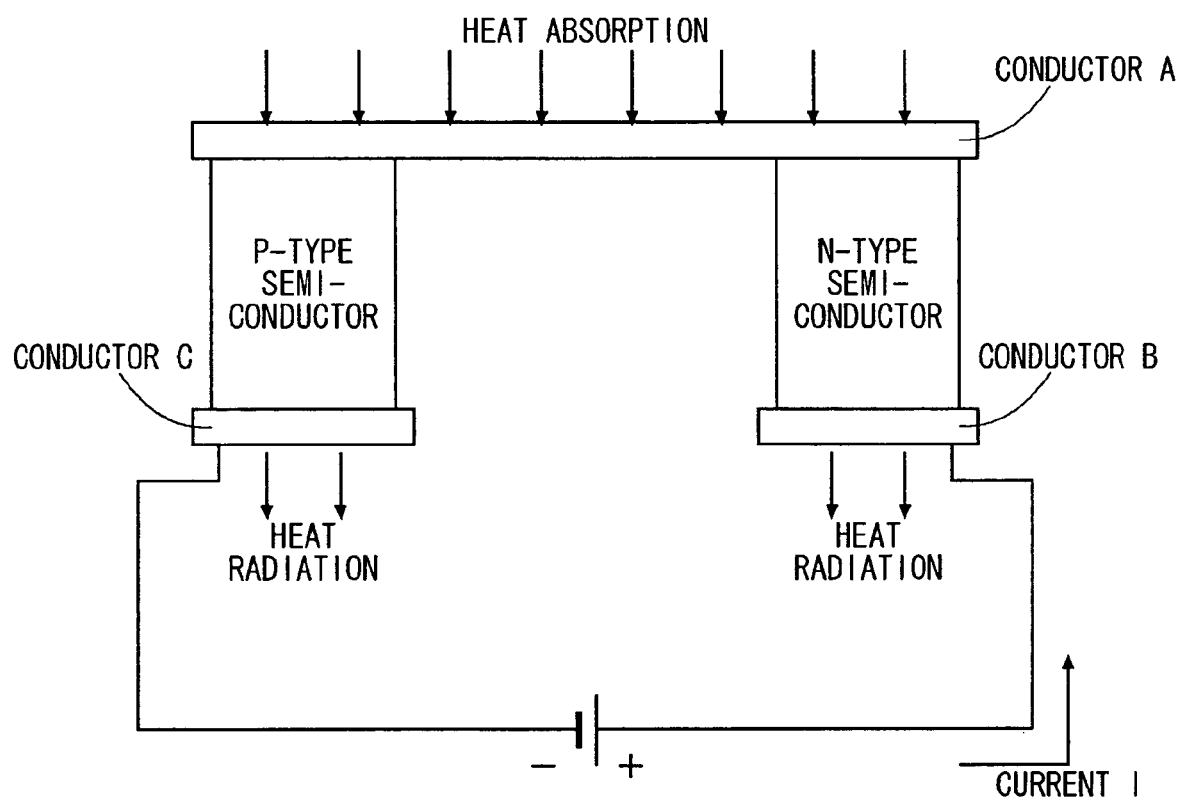
FIG. 2 is a diagrammatical view illustrating a cooling principle of a Peltier element.

FIG. 2 illustrates the cooling principle of a Peltier element. A Peltier element is a thermoelectric conversion device, and it has an n-type semiconductor and a p-type semiconductor connected in series through conductors such as metal. In such a Peltier element, when certain current is passed in this serial structure, heat absorption and heat radiation occur according to the direction of that current.

In the Peltier element of FIG. 2, the n-type semiconductor and the p-type semiconductor are connected through a conductor A, a conductor B is attached in one end of the n-type semiconductor, and a conductor C is attached in one end of the p-type semiconductor. Now, if a positive voltage (+) is applied to the conductor B, which is connected to the n-type semiconductor, and a negative voltage (−) is applied to the conductor C, which is connected to the p-type semiconductor, current I will flow in the direction of the conductor B→the N-type semiconductor→the conductor A→the P-type semiconductor→the conductor C. In this case, heat absorption takes place at the conductor A side and heat radiation takes place at the conductor B and conductor C sides.

Figure 3:
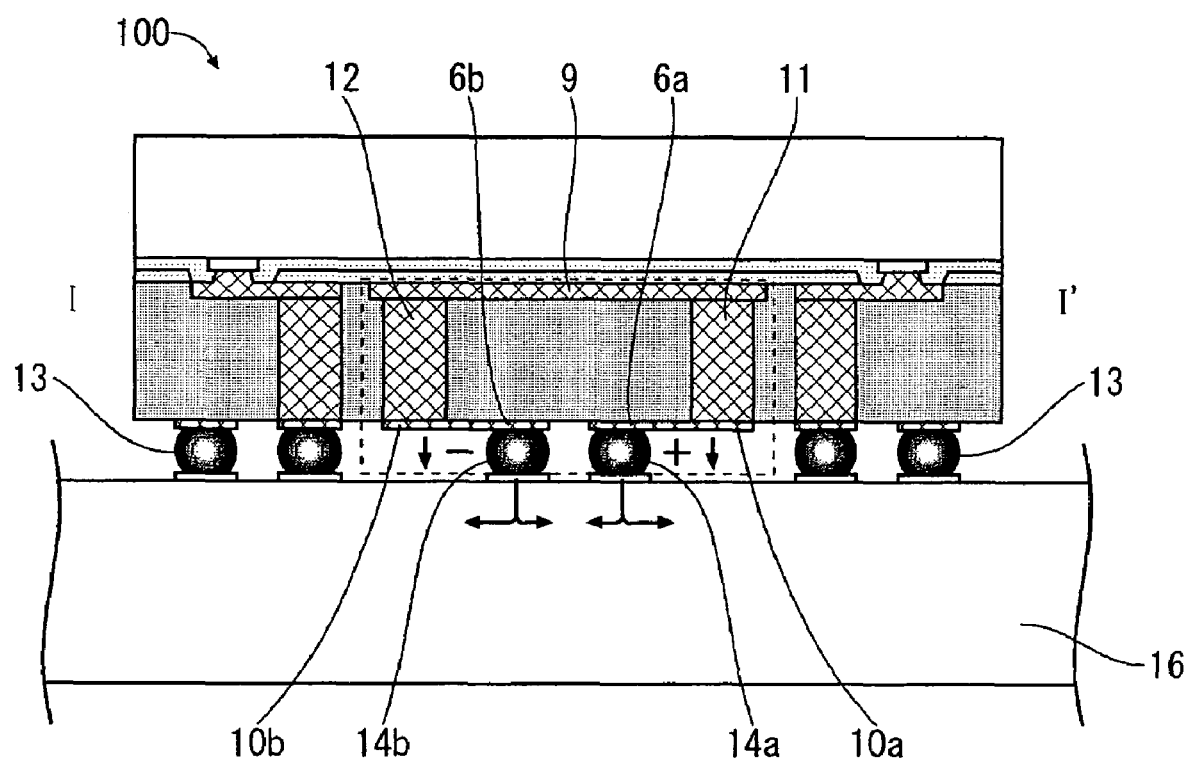
FIG. 3 is a cross-sectional view illustrating a cooling function and courses of heat absorption and heat radiation that can be produced by a Peltier element formed in the resin-sealed type semiconductor devices according to the first embodiment of the present invention.

FIG. 3 shows the cooling function and the courses of heat absorption and heat radiation (illustrated by arrows) that can be produced by the Peltier element formed in the resin-sealed type semiconductor device 100. In FIG. 3, the same reference numbers as used in FIG. 1B are attached to the corresponding composition elements of the resin-sealed type semiconductor device 100 of FIG. 3.

The resin-sealed type semiconductor device 100 is connected to a mounting substrate 16 through the spherical electrodes 13, 14a, and 14b. The portion surrounded by a dashed line in FIG. 3 is supposed to achieve the function of the Peltier element (i.e. the cooling structure). That is, the Peltier element in this case has the electrode pads 6a and 6b, the conductive layer 9, the conductive layers 10a and 10b, the n-type semiconductor 11, the p-type semiconductor 12, and the spherical electrodes 14a and 14b.

Now, if a positive voltage (+) is applied to the spherical electrode 14a and a negative voltage (−) is applied to the spherical electrode 14b, each from outside, current will flow in the direction of: the spherical electrode 14a→the electrode pad 6a→the conductive layer 10 a→the n-type semiconductor 11→the conductive layer 9÷the p-type semiconductor 12→the conductive layer 10b→the electrode pad 6b→the spherical electrode 14b.

Here, when compared with the Peltier element of FIG. 2, it is apparent that the conductive layer 9 corresponds to the conductor A, the conductive layer 10a corresponds to the conductor B and the conductive layer 10b corresponds to the conductor C. Accordingly, it is also apparent that heat absorption takes place at the side of the conductive layer 9, i.e. the side opposite the spherical electrodes 14a and 14b, and heat radiation takes place at the sides of the conductive layers 10a and 10b, i.e. the side facing the spherical electrodes 14*a* and 14*b*. The heat transmitted from the conductive layers 10*a* and 10*b* is directly emitted to space and also is transferred to the mounting substrate 16 through the electrode pads 6*a* and 6*b* and the spherical electrodes 14*a* and 14*b*.

In addition, the course of heat radiation from the semiconductor chip 1 is not limited to the one as described above. Here, only the course that relates to the present embodiment has been shown.

Manufacturing Method

Next, a method of manufacturing the resin-sealed type semiconductor device 100 according to the first embodiment of the present invention will be explained.

FIGS. 4A to 6B show the manufacturing processes of the resin-sealed type semiconductor device 100 in a simple manner. FIGS. 4A to 6B are based on the section of the position I-I' shown in FIG. 1B. In this particular embodiment, the method of manufacturing the resin-sealed type semiconductor device 100 uses the technique of W-CSP (Wafer-level Chip Size Package). According to the W-CSP, a sealing process is done at a wafer level. Accordingly, the processes as shown in FIGS. 4A to 6B are done at a wafer level.

Figure 4A:
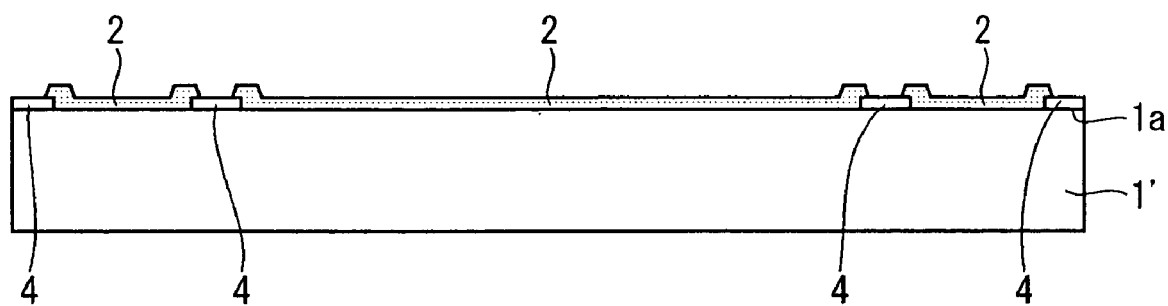
FIGS. 4A to 6B are cross-sectional views illustrating manufacturing processes of the resin-sealed type semiconductor device according to the first embodiment of the present invention.

First, as shown in FIG. 4A, a semiconductor wafer 1' whose electrical property has been estimated by wafer inspection is prepared. The semiconductor wafer 1' has the protective film 2 and the electrode pads 4 on the side or top of the element formation surface 1*a*. On the element formation surface 1*a*, an electronic circuitry (not shown) is constituted by semiconductor elements such as a transistor, and the electrode pads 4 are electrically connected to those semiconductor elements. The protective film 2 is formed on the semiconductor wafer 1' except for the area over the upper parts of the electrode pads 4. Generally, the protective film 2 is a silicone oxide film ($SiO_2$), but it can also be a silicone nitride film ($Si_3N_4$).

Figure 4B:
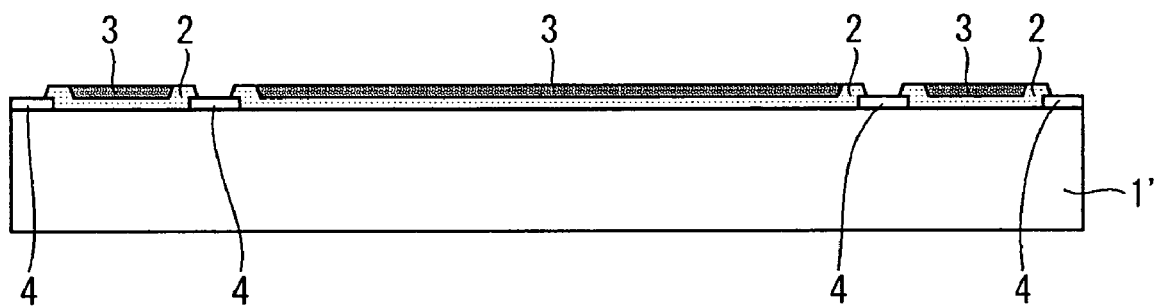

Next, as shown in FIG. 4B, a polyimide resin is applied over the whole surface of the semiconductor wafer 1', and the protective film 3 is formed except for the area over the upper parts of the electrode pads 4 by photolithography and etching.

Figure 4C:
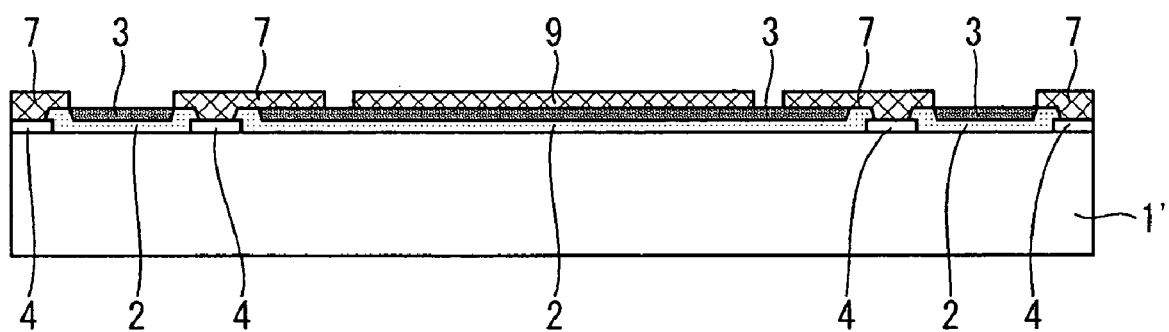

Next, as shown in FIG. 4C, Cu is deposited on the whole surface of the semiconductor wafer 1' by sputtering, and through photolithography and etching, the re-wiring layers 7 and the conductive layer 9 are formed. The re-wiring layers 7 are formed so that they connect to the electrode pads 4. Moreover, the conductive layer 9 is formed so that it electrically dissociates from the re-wiring layers 7. As for the material of the re-wiring layers 7 and the conductive layer 9, it is also possible to use Al or the like instead of Cu.

Figure 4D:
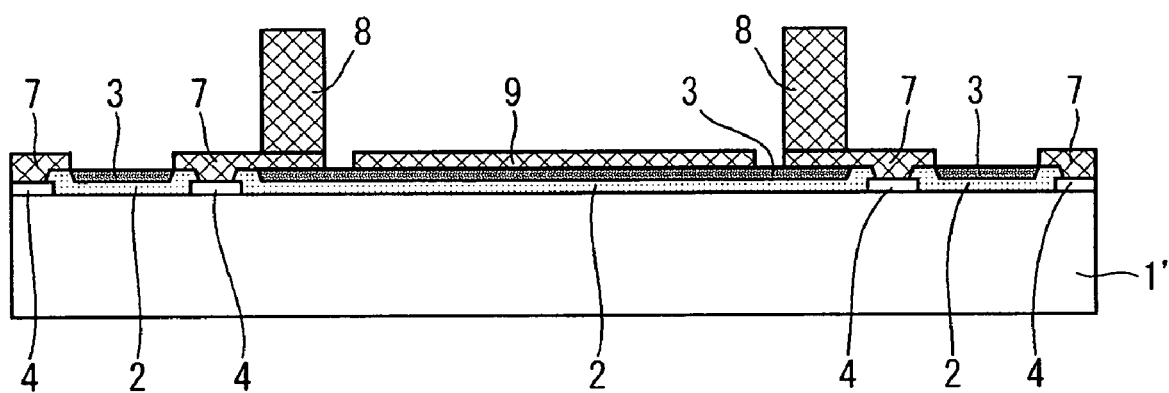

Next, as shown in FIG. 4D, the contact portions 8 made of Cu are formed on parts of the re-wiring layers 7 by electroplating. In this process, for instance, a resist medium is applied over the whole surface of the semiconductor wafer 1', and through processes of exposure and development, a resist having apertures which expose parts of the re-wiring layers 7 is formed. Then, through the process of soaking the semiconductor wafer 1' in a coating liquid including Cu, the apertures are filled up with the coating liquid. After the coating liquid is hardened, the resist is removed so that the contact portions 8 respectively are formed on the re-wiring layers 7. As for the material of the contact portion 8, it is also possible to use Al or the like instead of Cu.

Figure 5A:
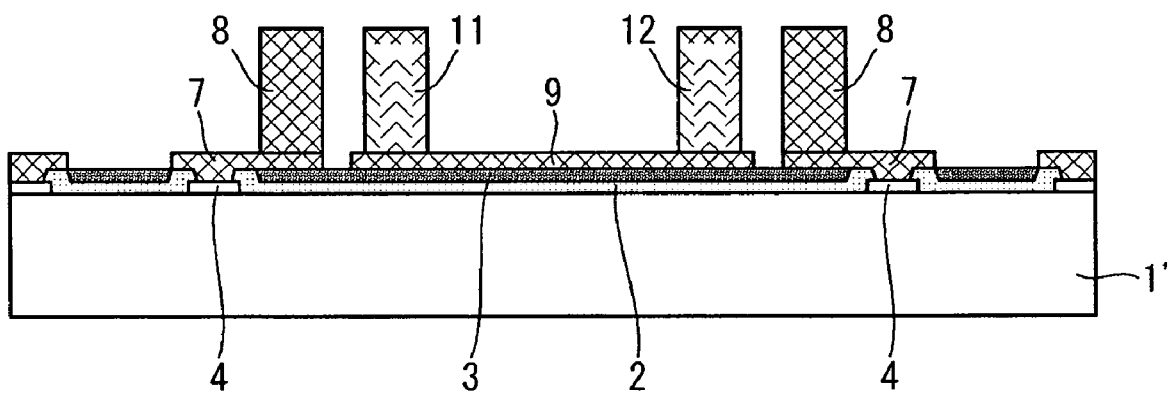

Next, as shown in FIG. 5A, the n-type semiconductor 11 and the p-type semiconductor 12 are formed on the conductive layer 9. For example, the n-type semiconductor 11 can be formed by cutting off a piece of an n-type semiconductor substrate and attaching it on the conductive layer 9 using an epoxy adhesive. Likewise, for example, the p-type semiconductor 12 can be formed by cutting off a piece of a p-type semiconductor substrate and attaching it on the conductive layer 9 using the epoxy adhesive.

Figure 5B:
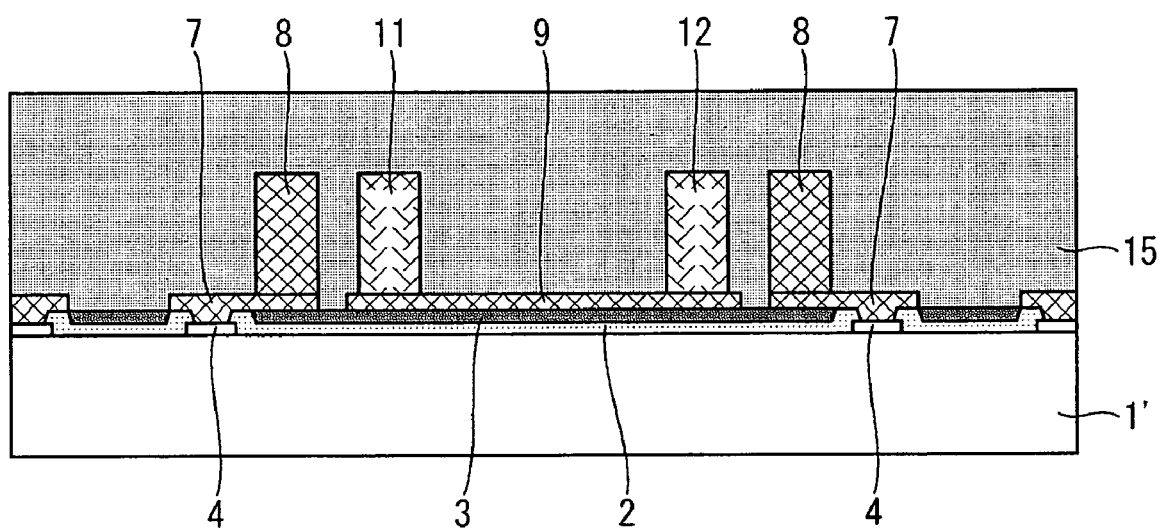

Next, as shown in FIG. 5B, the protective film 3, the re-wiring layers 7, the conductive layer 9, the contact portions 8, the n-type semiconductor 11, and the p-type semiconductor 12 are sealed by the sealing resin 15. Here, the sealing resin 15, for example, can be an epoxy resin or the like.

Figure 5C:
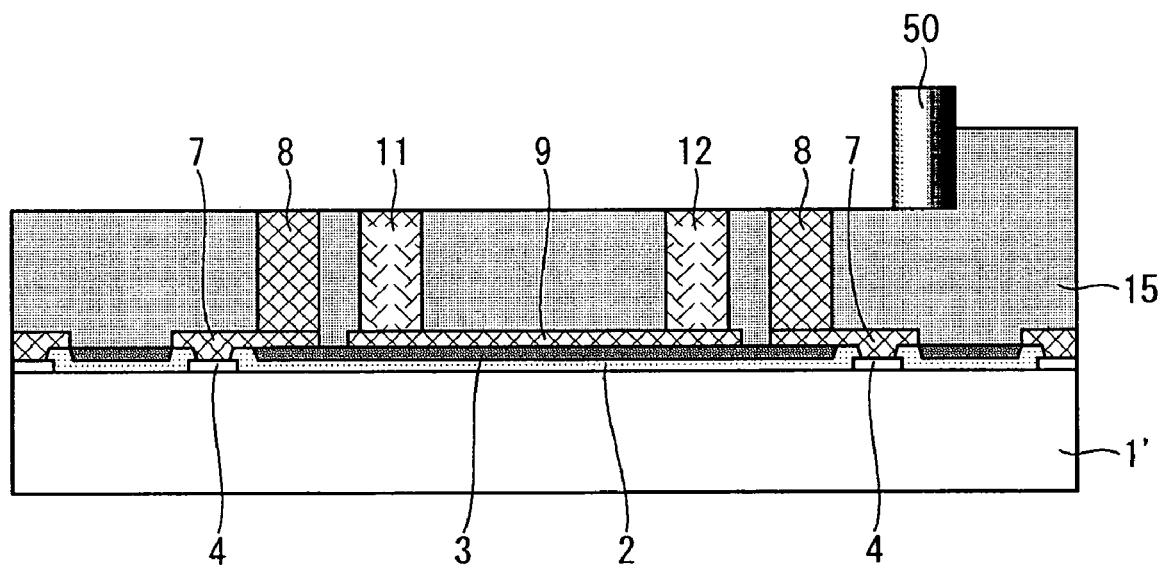

Next, as shown in FIG. 5C, the whole surface of the sealing resin 15 is etched (grinded). In this process, for example, the surface of the sealing resin 15 is grinded by a grind stone 50 as shown in FIG. 5C. Consequently, the surface of the contact portions 8, the n-type semiconductor 11 and the p-type semiconductor 12 are exposed.

Figure 5D:
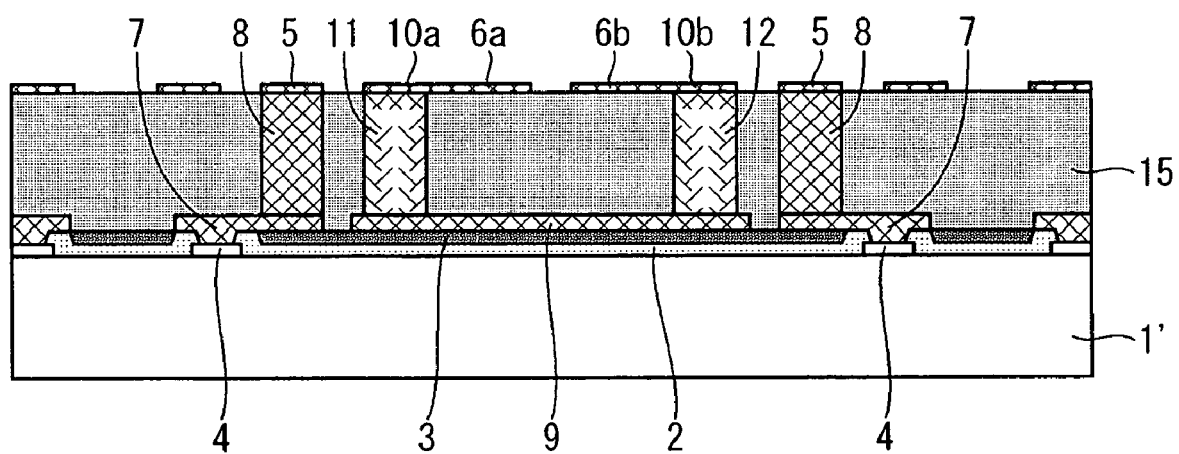

Next, as shown in FIG. 5D, Cu is deposited on the whole surface of the semiconductor wafer 1' by sputtering, and through photolithography and etching, the electrode pads 5 are formed on the contact portions 8. At the same time, the conductive layers 10*a* and the electrode pad 6*a* are formed on the n-type semiconductor 11, and the conductive layers 10*b* and the electrode pad 6*b* are formed on the p-type semiconductor 12. As for the material of the electrode pads 5, 6*a* and 6*b*, and the conductive layers 10*a* and 10*b*, it is also possible to use Al or the like instead of Cu.

Figure 6A:
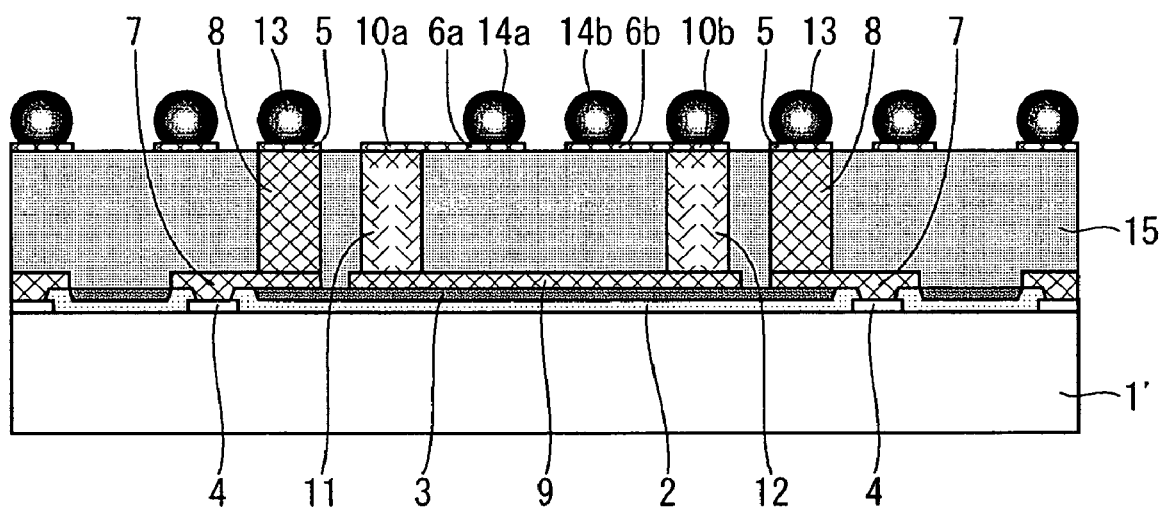

Next, as shown in FIG. 6A, the spherical electrodes 13 made of solder are formed on the electrode pads 5, the spherical electrode 14*a* made of solder is formed on the electrode pad 6*a*, and the spherical electrode 14*b* made of the solder is formed on the electrode pad 6*b*. The spherical electrodes 13, 14*a*, and 14*b* are, for example, formed by ball mounting.

Figure 6B:
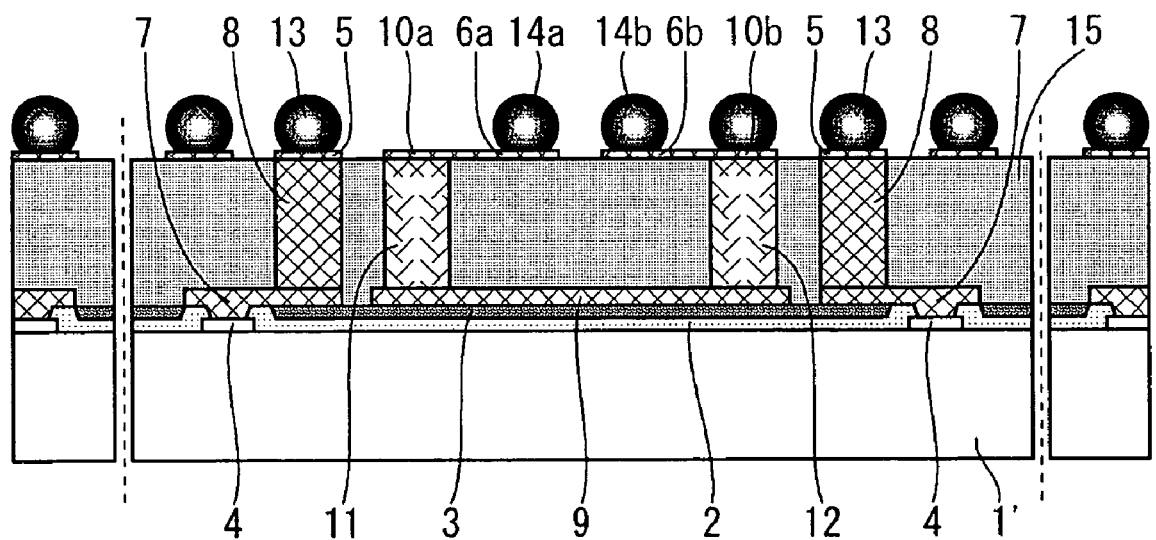

Finally, as shown in FIG. 6B, the semiconductor wafer 1' is divided into pieces, and the formation of the resin-sealed type semiconductor device 100 is completed.

Operation Effect

According to the semiconductor device of the first embodiment of the present invention, by integrating the Peltier element inside the resin-sealed type semiconductor device 100, miniaturization of a package can be realized.

Furthermore, generally, in case that a separate Peltier element is attached to a semiconductor device, possible air or other particles trapped inside the semiconductor device when the Peltier element is attached can cause deterioration in the cooling function. However, in accordance with the first embodiment of the present invention, the components constituting the Peltier element, i.e. the electrode pads 6*a* and 6*b*, the conductive layer 9, the conductive layers 10*a* and 10*b*, the n-type semiconductor 11, the p-type semiconductor 12, and the spherical electrodes 14*a* and 14*b* are arranged relatively closely. Therefore, such deterioration in the cooling function due to trapped air or the like does not occur. Accordingly, possible advantages of the Peltier element can be demonstrated to the maximum extent, and heat radiation efficiency of the semiconductor device can be improved.

Moreover, almost the entire manufacturing process including the formation of the Peltier element can be carried out in batch processing at a wafer level, thereby cost reduction is also realized.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Alternate Embodiments

Alternate embodiments will now be explained. In view of the similarity between the first and alternate embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

(2) Second Embodiment

Structure

Next, a structure of a resin-sealed type semiconductor device 101 according to a second preferred embodiment of the present invention will be explained.

Figure 7A:
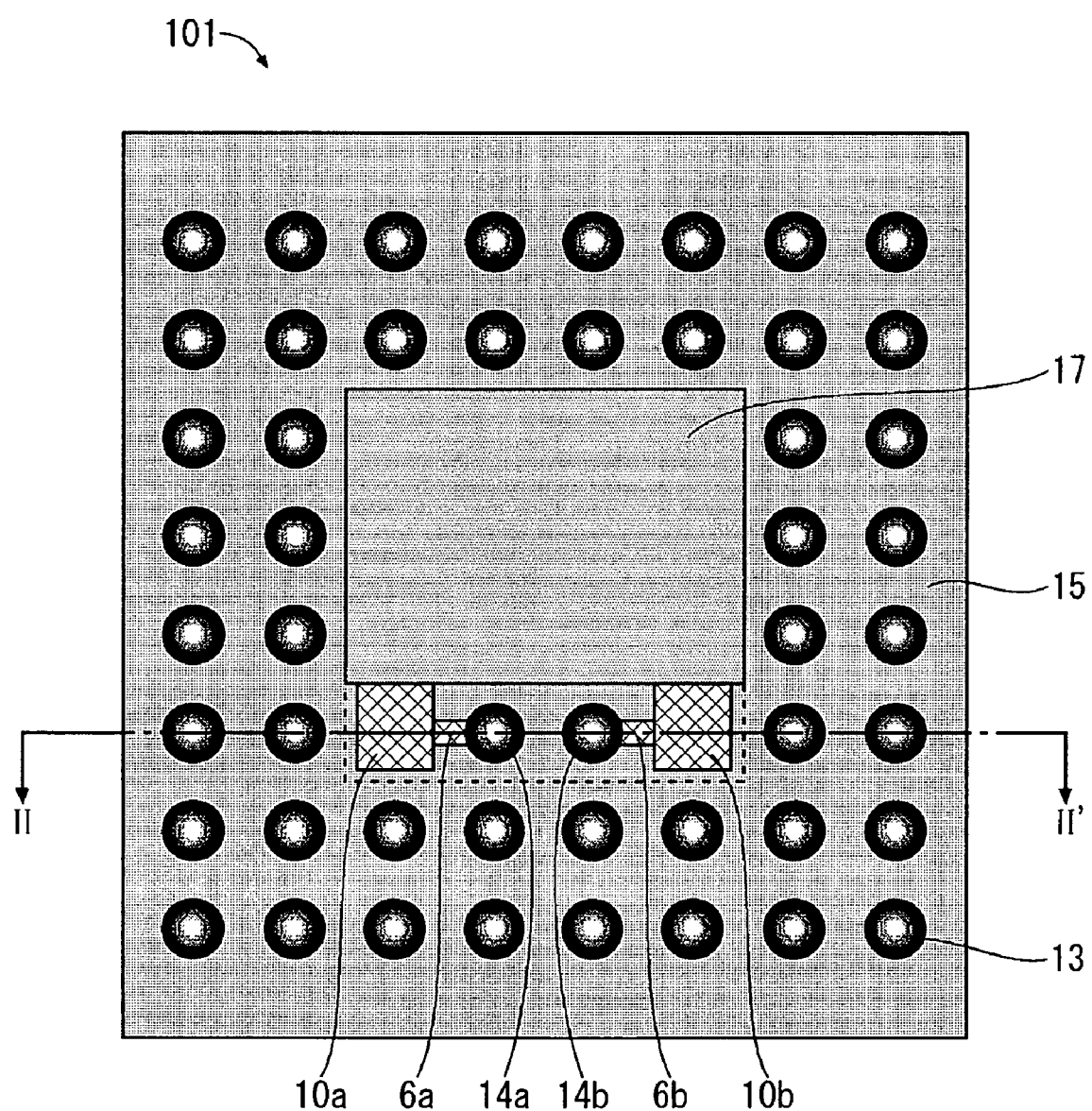
FIG. 7A is a plan view of a resin-sealed type semiconductor device according to a second preferred embodiment of the present invention.
Figure 7B:
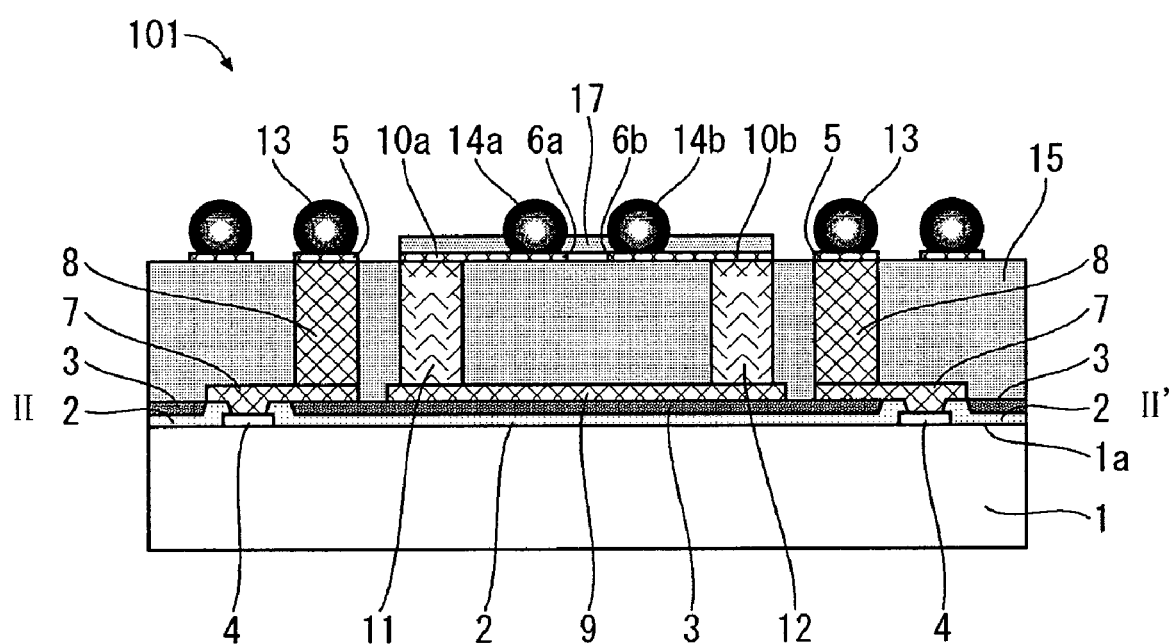
FIG. 7B is a cross-sectional diagrammatical view taken along line II-II' shown in FIG. 7A.

FIGS. 7A and 7B are views showing the structure of the resin-sealed type semiconductor device 101 according to the second embodiment of the present invention. FIG. 7A is a plan view of the resin-sealed type semiconductor device 101, and FIG. 7B is a cross-sectional diagrammatical view taken along line II-II' shown in FIG. 7A.

As shown in FIGS. 7A and 7B, the resin-sealed type semiconductor device 101 has the same or similar structure as that of the resin-sealed type semiconductor device 100 according to the first embodiment, but further has a radiating material 17 on the conductive layers 10a and 10b as the primary distinguishing feature. The radiating material 17 is preferably a ceramic plate. Desirably, this radiating material 17 should be formed on the conductive layers 10a and 10b so that it overlaps each of the conductive layers 10a and 10b as shown in FIG. 7A. However, it is not necessary to form the radiating material 17 as a single unit. In other words, it is possible to form separate radiating materials 17 on each of the conductive layer 10a and the conductive layer 10b.

In addition, since the radiating material 17 being a ceramic plate is an insulator, the spherical electrodes 13, 14a, and 14b should be exposed from the radiating material 17 in order to connect electrically to the other elements (e.g. the mounting substrate 16 shown in FIG. 3).

In FIGS. 7A and 7B, as for the structure elements of the resin-sealed type semiconductor device 101 that are the same as or very similar to those of the resin-sealed type semiconductor device 100 according to the first embodiment, the same reference numbers used in FIGS. 1A and 1B are to be used and redundant description on the same structure will be omitted.

Cooling Function

Next, a cooling function in the resin-sealed type semiconductor device 101 according to the second embodiment of the present invention will be explained.

The cooling function of the resin-sealed type semiconductor device 101 uses a double structure that is constructed from the Peltier element and the radiating materials.

In the resin-sealed type semiconductor device 101, the cooling effect is improved by a synergistic effect that can be acquired by an enforced cooling effect and a natural cooling effect. The enforced cooling effect can be acquired by the Peltier element constructed from the electrode pads 6a and 6b, the conductive layers 9, 10a, and 10b, the n-type semiconductor 11, the p-type semiconductor 12, and the spherical electrodes 14a and 14b, and the natural cooling effect can be acquired by the radiating material 17 made of ceramic.

Manufacturing Method

Next, a method of manufacturing the resin-sealed type semiconductor device 101 according to the second embodiment of the present invention will be explained.

In the method of manufacturing the resin-sealed type semiconductor device 101, the process of forming the spherical electrodes 13, 14a, and 14b up to the process of preparing the semiconductor wafer 1' whose electrical property has been estimated by wafer inspection are the same as the processes shown in FIGS. 4A to 6A with respect to the first embodiment of the present invention. Furthermore, in the second embodiment, a process of forming the radiating material 17 on the conductive layers 10a and 10b is added after the process of forming the spherical electrodes 13, 14a, and 14b shown in FIG. 6A.

Referring to FIG. 7B, for example, the radiating material 17 can be formed by attaching a ceramic plate on the conductive layer 9 using an epoxy adhesive. After the formation of the radiating material 17, as shown in FIG. 6B, the semiconductor wafer 1' is divided into pieces, and the formation of the resin-sealed type semiconductor device 101 is completed.

Operation Effect

According to the semiconductor device of the second embodiment of the present invention, by integrating the Peltier element inside the resin-sealed type semiconductor device 101, miniaturization of a package can be realized. In addition, the components constituting the Peltier element are arranged relatively closely, and this allows the Peltier element to demonstrate the Peltier effect to the maximum extent. Thereby, the heat radiation efficiency of the semiconductor device can be improved.

Furthermore, since ceramic has high heat conduction and high heat radiation, the heat radiation efficiency of the semiconductor device can be further improved by forming the radiating material 17 made of ceramic on the conductive layers 10a and 10b.

Moreover, almost the entire manufacturing process including the formation of the Peltier element and the radiating material 17 can be carried out in batch processing at a wafer level, and thereby, cost reduction is also made possible.

(3) Third Embodiment

Structure

Next, a structure of a resin-sealed type semiconductor device 102 according to a third preferred embodiment of the present invention will be explained.

Figure 8A:
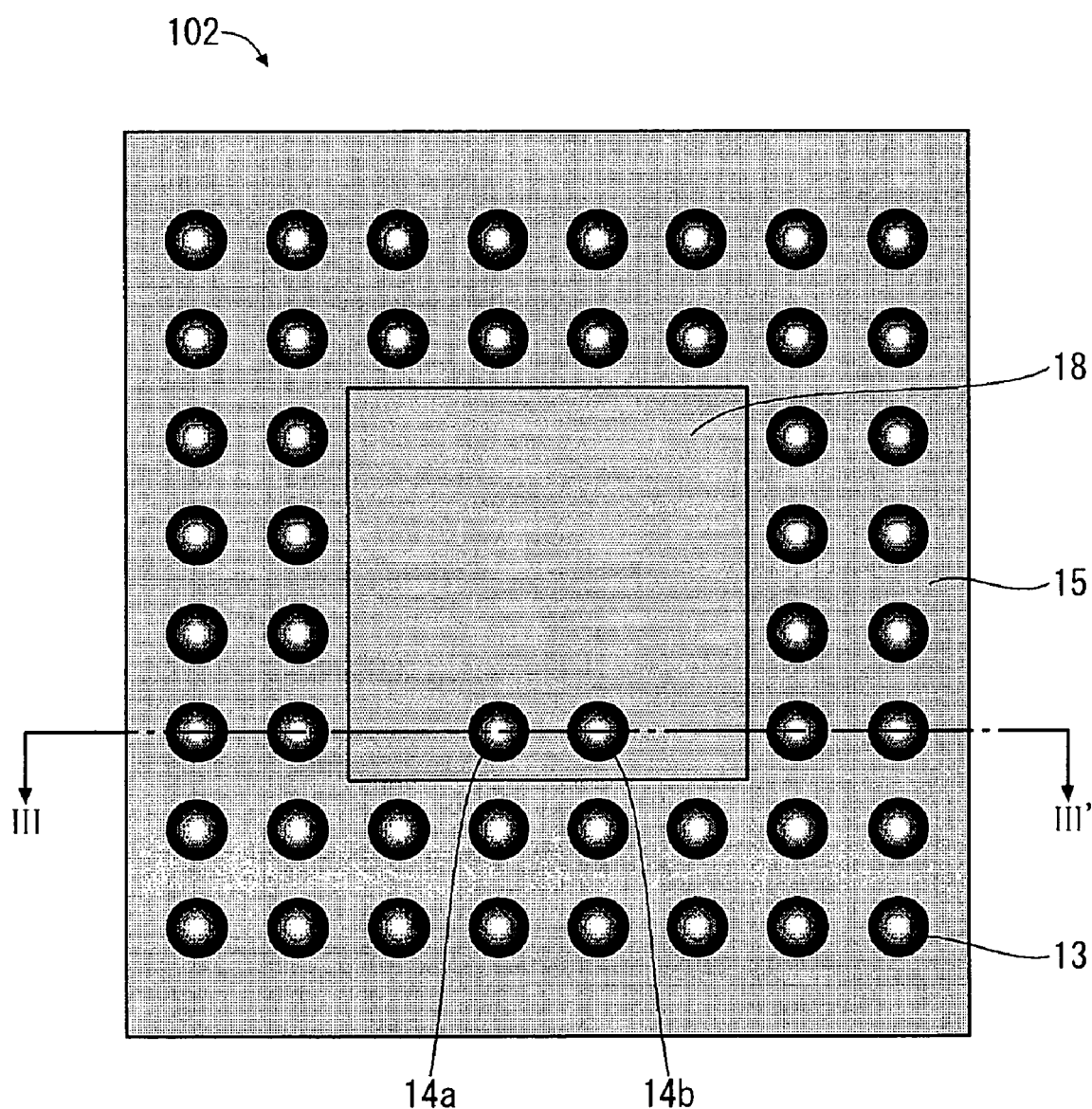
FIG. 8A is a plan view of a resin-sealed type semiconductor device according to a third preferred embodiment of the present invention.
Figure 8B:
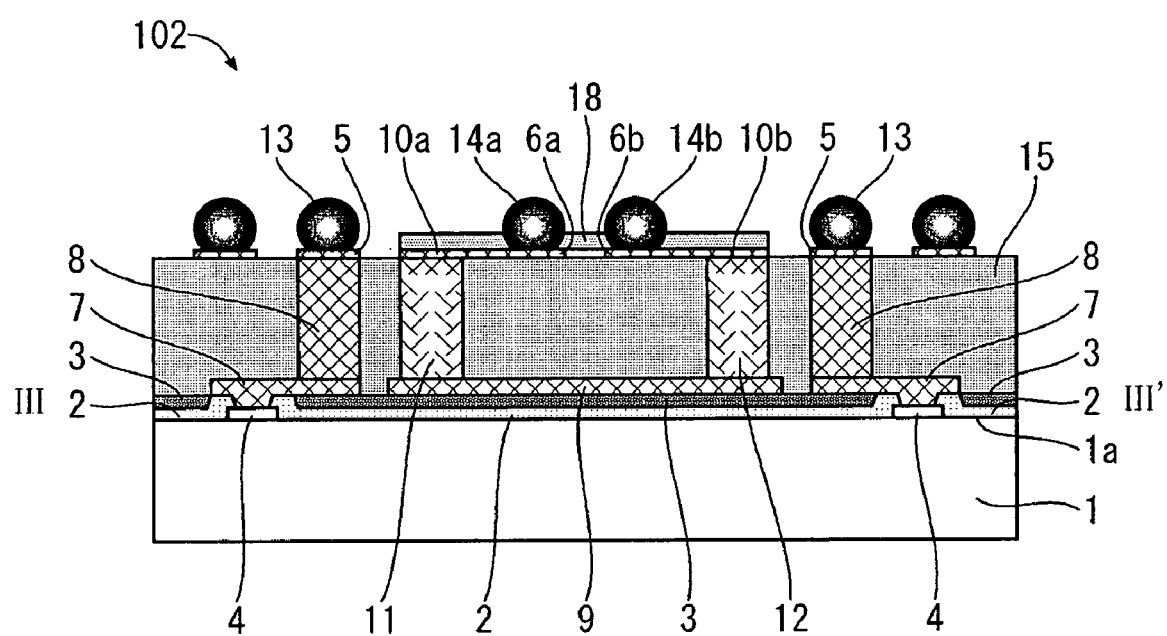
FIG. 8B is a cross-sectional diagrammatical view taken along line III-III' shown in FIG. 8A.

FIGS. 8A and 8B are views showing the structure of the resin-sealed type semiconductor device 102 according to the third embodiment of the present invention. FIG. 8A is a plan view of the resin-sealed type semiconductor device 102, and FIG. 8B is a cross-sectional diagrammatical view taken along line III-III' shown in FIG. 8A.

As shown in FIGS. 8A and 8B, the resin-sealed type semiconductor device 102 has the same or similar structure as that of the resin-sealed type semiconductor device 100 according to the first embodiment, but further has a radiating material 18 on the conductive layers 10a and 10b as the primary distinguishing feature. The radiating material 18 is a liquid ceramic that has been hardened. Desirably, this radiating material 18 should be formed on the conductive layers 10a and 10b so that it overlaps each of the conductive layers 10a and 10b as shown in FIG. 8A. However, it is not necessary to form the radiating material 18 as a single unit. In other words, it is possible to form separate radiating material 18 on each of the conductive layer 10a and the conductive layer 10b.

In addition, since the radiating material 18 being a liquid ceramic is an insulator, the spherical electrodes 13, 14a, and 14b should be exposed from the radiating material 18 in order to connect electrically to the other elements (e.g. the mounting substrate 16 shown in FIG. 3).

In FIGS. 8A and 8B, as for the structure elements of the resin-sealed type semiconductor device 102 that are the same as or very similar to those of the resin-sealed type semiconductor device 100 according to the first embodiment, the same reference numbers used in FIGS. 1A and 1B are to be used and redundant description on the same structure will be omitted.

Cooling Function

Next, a cooling function of the resin-sealed type semiconductor device 102 according to the third embodiment of the present invention will be explained.

The cooling function of the resin-sealed type semiconductor device 102 uses a double structure that is constructed from the Peltier element and the radiating materials.

In the resin-sealed type semiconductor device 102, the cooling effect is improved by a synergistic effect that can be acquired by an enforced cooling effect and a natural cooling effect. The enforced cooling effect can be acquired by the Peltier element constructed from the electrode pads 6a and 6b, the conductive layers 9, 10a, and 10b, the n-type semiconductor 11, the p-type semiconductor 12, and the spherical electrodes 14a and 14b, and the natural cooling effect can be acquired by the radiating material 18 made of ceramic.

Manufacturing Method

Next, a method of manufacturing the resin-sealed type semiconductor device 102 according to the third embodiment of the present invention will be explained.

In the method of manufacturing the resin-sealed type semiconductor device 102, the process of forming the spherical electrodes 13, 14a, and 14b up to the process of preparing the semiconductor wafer 1' whose electrical property has been estimated by wafer inspection are the same as the processes shown in FIGS. 4A to 6A with respect to the first embodiment of the present invention. Furthermore, in the third embodiment, a process of forming the radiating material 18 on the conductive layers 10a and 10b is added after the process of forming the spherical electrodes 13, 14a, and 14b shown in FIG. 6A.

Referring to FIG. 8B, in forming the radiating material 18, a liquid ceramic is applied on the conductive layers 10a and 10b, and the liquid ceramic is hardened, for example, by a heat treatment at 50 degrees C. for 36 Hr. At this time, it is possible to use a spray to apply the liquid ceramic. After the formation of the radiating material 18, as shown in FIG. 6B, the semiconductor wafer 1' is divided into pieces, and the formation of the resin-sealed type semiconductor device 102 is completed.

Operation Effect

According to the semiconductor device of the third embodiment of the present invention, by integrating the Peltier element inside the resin-sealed type semiconductor device 102, miniaturization of a package can be realized. In addition, the components constituting the Peltier element are arranged closely, and this allows the Peltier element to demonstrate the Peltier effect to the maximum extent. Thereby, the heat radiation efficiency of the semiconductor device can be improved.

Furthermore, since ceramic has high heat conduction and high heat radiation, the heat radiation efficiency of the semiconductor device can be further improved by forming the radiating material 18 made of ceramic on the conductive layers 10a and 10b.

Moreover, since the radiating material 18 is formed by applying a liquid ceramic, it can be formed in any desired region at any desired range. Therefore, improved flexibility in the design of the cooling structure can be achieved. Moreover, since the liquid ceramic can be applied by using a spray or the like, the process of forming the radiating material 18 can be done simply. Therefore, operating efficiency can be improved.

Moreover, almost the entire manufacturing process including the formation of the Peltier element and the radiating material 18 can be carried out in batch processing at a wafer level, and thereby, cost reduction can also be realized.

(4) Fourth Embodiment

Structure

Next, a structure of a resin-sealed type semiconductor device 103 according to a fourth preferred embodiment of the present invention will be explained.

Figure 9A:
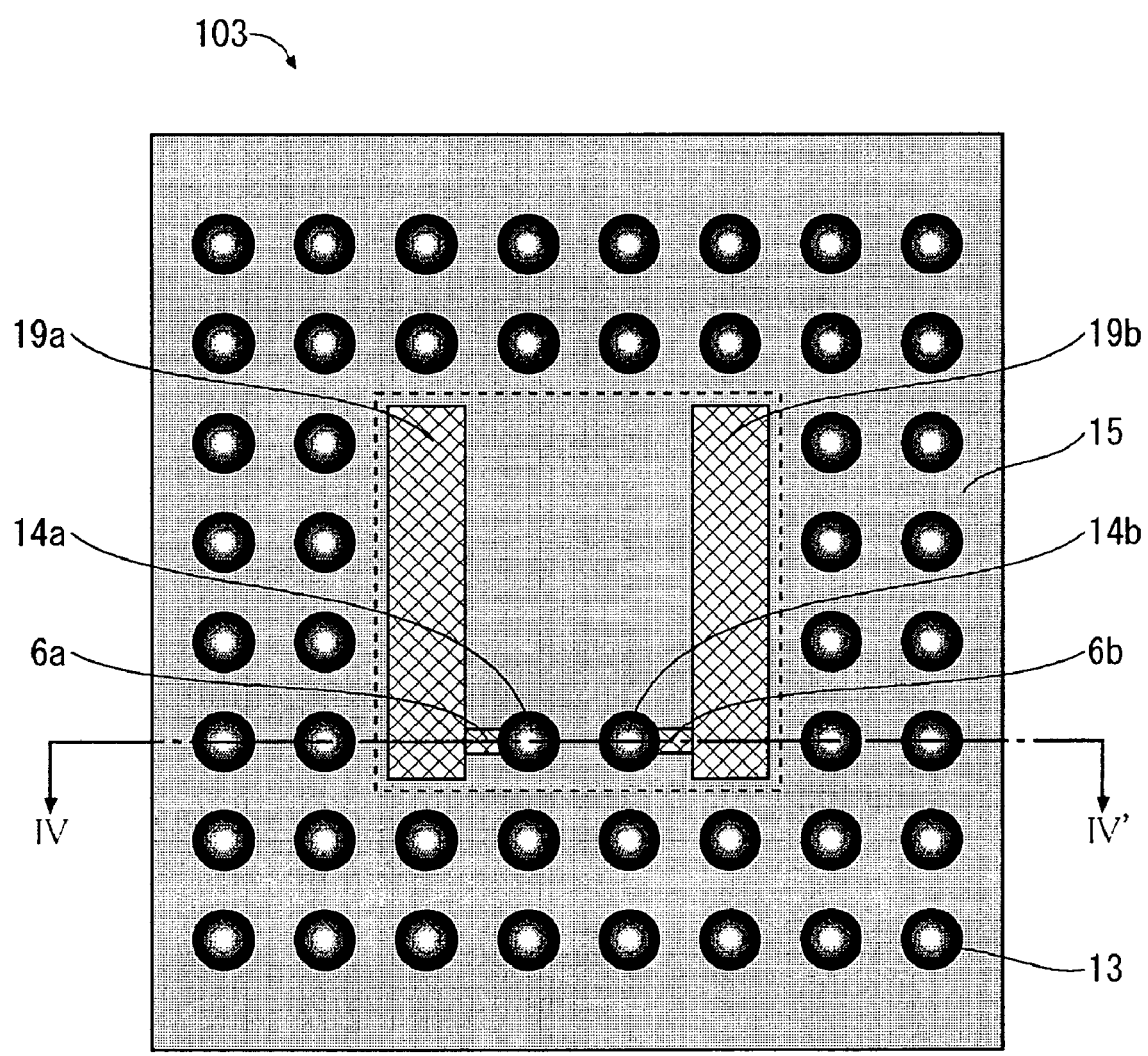
FIG. 9A is a plan view of a resin-sealed type semiconductor device according to a fourth preferred embodiment of the present invention.
Figure 9B:
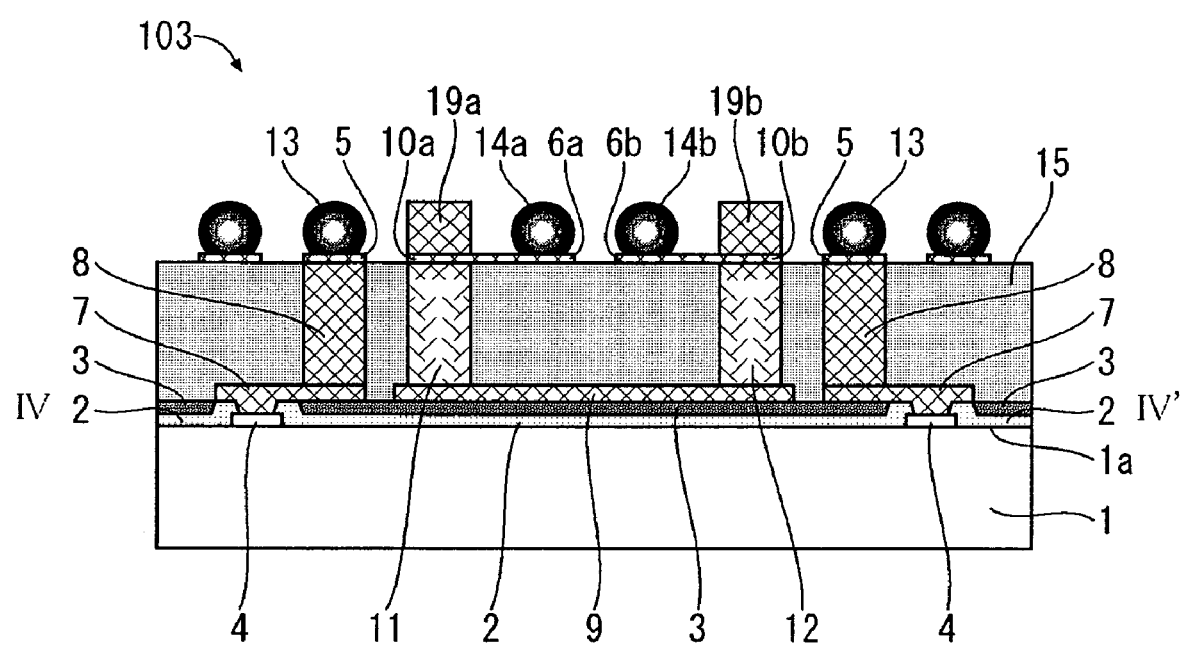
FIG. 9B is a cross-sectional diagrammatical view taken along line IV-IV' shown in FIG. 9A.

FIGS. 9A and 9B are views showing the structure of the resin-sealed type semiconductor device 103 according to the fourth embodiment of the present invention. FIG. 9A is a plan view of the resin-sealed type semiconductor device 103, and FIG. 9B is a cross-sectional diagrammatical view taken along line IV-IV' shown in FIG. 9A.

As shown in FIGS. 9A and 9B, the resin-sealed type semiconductor device 103 invention has the same or similar structure as that of the resin-sealed type semiconductor device 100 according to the first embodiment, but further has a radiating material 19a on the conductive layer 10a and a radiating material 19b on the conductive layer 10b as the primary distinguishing feature. The radiating materials 19a and 19b are, for example, metals such as Cu, Al, and so on. The height of each of the radiating materials 19a and 19b is approximately the same as the height of the spherical electrodes 13, 14a, and 14b. Desirably, this radiating material 19a should be formed on the conductive layer 10a so that it overlaps the conductive layer 10a as shown in FIG. 9A. However, it is not necessary to form the radiating material 19a to have the same figure or outline as that of the conductive layer 10a of the upper surface. Likewise, desirably, the radiating material 19b should be formed on the conductive layer 10b so that it overlaps the conductive layer 10b as shown in FIG. 9A. However, it is not necessary to form the radiating material 19b to have the same figure or outline as that of the conductive layer 10b of the upper surface.

In addition, the radiating materials 19a and 19b should be separated from each other by a predetermined distance in order to insulate each other. Furthermore, the radiating material 19a should be insulated from the spherical electrodes other than the spherical electrode 14a, i.e. the spherical electrodes 13 and 14b. Likewise, the radiating material 19b should be insulated form the spherical electrodes other than the spherical electrode 14b, i.e. the spherical electrodes 13 and 14a.

In FIGS. 9A and 9B, as for the structure elements of the resin-sealed type semiconductor device 103 that are the same as or very similar to those of the resin-sealed type semiconductor device 100 according to the first embodiment, the same reference numbers used in FIGS. 1A and 1B are to be used and redundant description on the same structure will be omitted.

Cooling Function

Next, a cooling function in the resin-sealed type semiconductor device 103 according to the fourth embodiment of the present invention will be explained.

The cooling function of the resin-sealed type semiconductor device 103 uses a double structure that is constructed from the Peltier element and the radiating materials.

Figure 10:
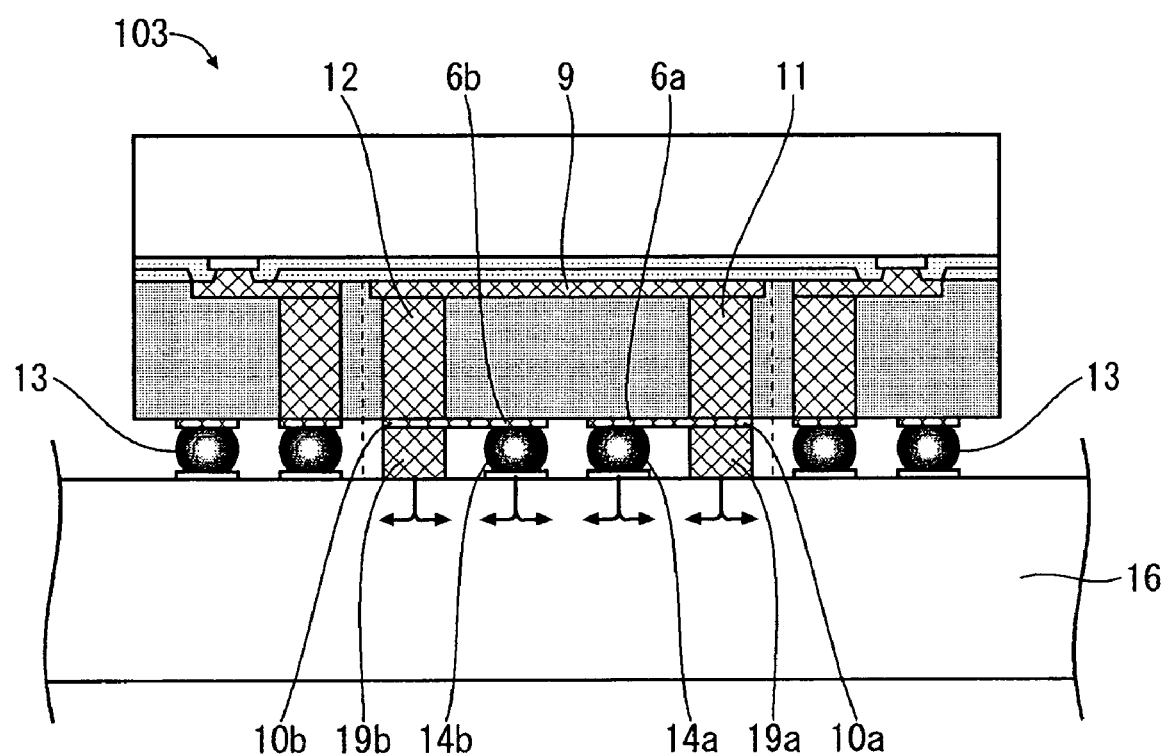
FIG. 10 is cross-sectional view illustrating a cooling function and courses of heat absorption and heat radiation that can be produced by a Peltier element formed in the resin-sealed type semiconductor devices according to the fourth embodiment of the present invention.

FIG. 10 shows the cooling function by the Peltier element that is mounted inside the resin-sealed type semiconductor device 103, and courses of heat radiation which are illustrated by arrows. In FIG. 10, the same reference numbers as used in FIG. 9B are attached to the corresponding composition elements of the resin-sealed type semiconductor device 103.

The resin-sealed type semiconductor device 103 is connected to the mounting substrate 16 through the spherical electrodes 13, 14a, and 14b. At this time, the radiating materials 19a and 19b are also electrically connected to the mounting substrate 16. This connection of the radiating materials 19a and 19b and the mounting substrate 16 is, for example, achieved through metal pads formed on the surface of the substrate 16. The metal pads may electrically float inside the mounting substrate 16, or be connected with inner patterns formed in the mounting substrate 16. If the metal pads are connected with the inner patterns, the radiating material 19a and the spherical electrode 14a should be electrically connected to the same inner pattern, and the radiating material 14b and the spherical electrode 14b should be electrically connected to the same inner pattern.

The heat on the resin-sealed type semiconductor device 103 is transmitted to the conductive layers 10a and 10b by the Peltier element constructed from the electrode pads 6a and 6b, the conductive layers 9, 10a and 10b, the n-type semiconductor 11, the p-type semiconductor 12, and the spherical electrodes 14a and 14b, and through the electrode pads 6a and 6b, and the spherical electrodes 14a and 14b, finally reaching the mounting substrate 16 where it is radiated. At the same time, the heat transmitted to the conductive layers 10a and 10b also reaches the mounting substrate 16 through the radiating material 19a and 19b, and the metal pads, and is radiated therefrom.

In addition, the course of heat radiation from the semiconductor chip 1 is not limited to the one as describe above. Here, only the course that relates to the present embodiment has been shown.

Manufacturing Method

Next, a method of manufacturing the resin-sealed type semiconductor device 103 according to the fourth embodiment of the present invention will be explained.

In the method of manufacturing the resin-sealed type semiconductor device 103, the process of forming the spherical electrodes 13, 14a, and 14b up to the process of preparing the semiconductor wafer 1' whose electrical property has been estimated by wafer inspection are the same as the processes shown in FIGS. 4A to 6A with respect to the first embodiment of the present invention. Furthermore, in the fourth embodiment, processes of forming the radiating material 19a on the conductive layers 10a and forming the radiating material 19b on the conductive layer 10b are added after the process of forming the spherical electrodes 13, 14a, and 14b shown in FIG. 6A.

Referring to FIG. 9B, for example, the radiating material 19a and 19b can be respectively formed by attaching bits of metal such as Cu and so forth on the conductive layers 10a and 10b using an epoxy adhesive. At this time, the radiating materials 19a and 19b should be separated form each other by a predetermined distance in order to insulate each other. After the formation of the radiating materials 19a and 19b, as shown in FIG. 6B, the semiconductor wafer 1' is divided into pieces, and the formation of the resin-sealed type semiconductor device 103 is completed.

Operation Effect

According to the semiconductor device of the fourth embodiment of the present invention, by integrating the Peltier element inside the resin-sealed type semiconductor device 103, miniaturization of a package can be realized. In addition, the components constituting the Peltier element are arranged relatively closely, and this allows the Peltier element to demonstrate the Peltier effect to the maximum extent. Thereby, the heat radiation efficiency of the semiconductor device can be improved.

Furthermore, since metal has high heat conduction, the heat radiation efficiency of the semiconductor can be device further improved by forming the radiating materials 19a and 19b made of metal on the conductive layers 10a and 10b, respectively, and connecting the radiating materials 19a and 19b to the mounting substrate 16.

Moreover, almost the entire manufacturing process including the formation of the Peltier element and the radiating materials 19a and 19b can be carried out in batch processing at a wafer level, and thereby, cost reduction can also be realized.

(5) Fifth Embodiment

Structure

Next, a structure of a resin-sealed type semiconductor device 104 according to a fifth preferred embodiment of the present invention will be explained.

Figure 11B:
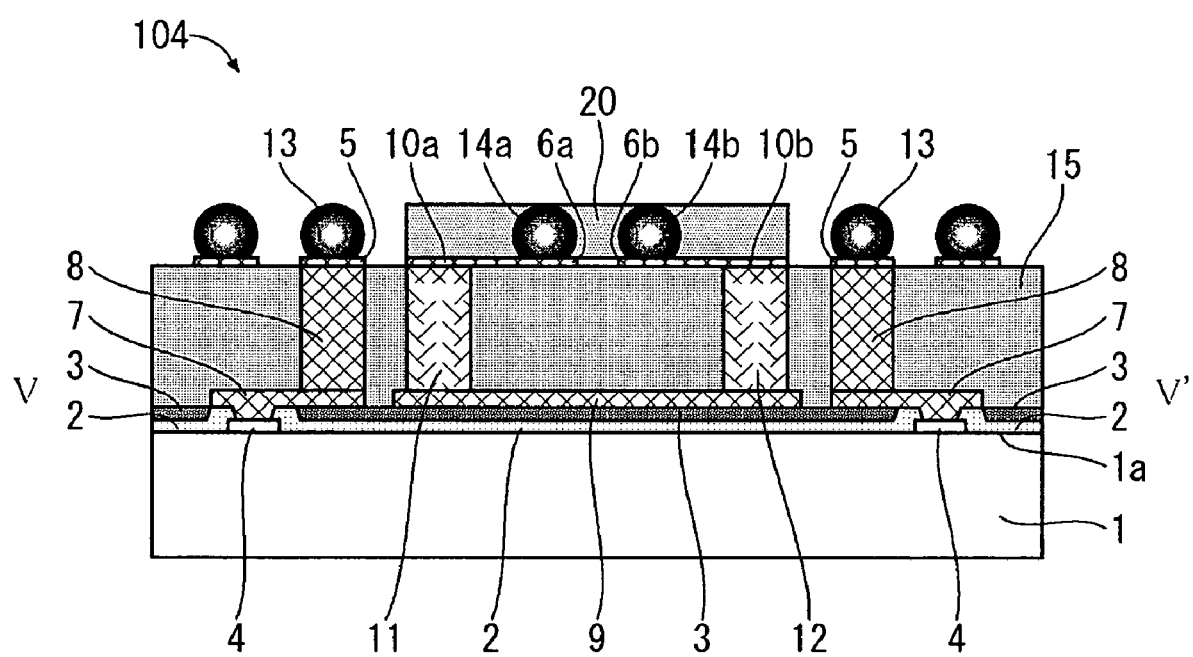
FIG. 11B is a cross-sectional diagrammatical view taken along line V-V' shown in FIG. 11A.

FIGS. 11A and 11B are views showing the structure of the resin-sealed type semiconductor device 104 according to the fifth embodiment of the present invention. FIG. 11A is a plan view of the resin-sealed type semiconductor device 104, and FIG. 11B is a cross-sectional diagrammatical view taken along line V-V' shown in FIG. 11A.

As shown in FIGS. 11A and 11B, the resin-sealed type semiconductor device 104 has the same or similar structure as that of the resin-sealed type semiconductor device 100 according to the first embodiment, but further has a radiating material 20 provided on the conductive layers 10a and 10b. The radiating material 20 is a liquid ceramic that has been hardened. The height of the radiating material 20 is approximately the same as the height of the spherical electrodes 13, 14a, and 14b. Desirably, this radiating material 20 should be formed on the conductive layers 10a and 10b so that it overlaps each of the conductive layers 10a and 10b as shown in FIG. 11A. However, it is not necessary to form the radiating material 20 as a single unit. In other words, it is possible to form separate radiating material 20 on each of the conductive layer 10a and the conductive layer 10b.

In addition, since the radiating material 20 being a liquid ceramic is an insulator, the spherical electrodes 13, 14a, and 14b should be exposed from the radiating material 20 in order to connect electrically to the other elements (e.g. a mounting substrate 16 shown in FIG. 10).

In FIGS. 11A and 11B, as for the structure elements of the resin-sealed type semiconductor device 104 that are the same as or very similar to those of the resin-sealed type semiconductor device 100 according to the first embodiment, the same reference numbers used in FIGS. 1A and 1B are to be used and redundant description on the same structure will be omitted.

Cooling Function

Next, a cooling function in the resin-sealed type semiconductor device 104 according to the fourth embodiment of the present invention will be explained.

The cooling function of the resin-sealed type semiconductor device 104 uses a double structure that is constructed from the Peltier element and the radiating materials.

As with the resin-sealed semiconductor device 103 according to the fourth embodiment of the present invention, the resin-sealed type semiconductor device 104 is connected with the mounting substrate 16 through the spherical electrodes 13, 14*a*, and 14*b*. At this time, the radiating material 20 is also electrically connected with the mounting substrate 16 as with the radiating materials 19*a* and 19*b* in the fourth embodiment. This connection of the radiating material 20 and the mounting substrate 16 is, for example, achieved through metal pads formed on the surface of the substrate 16. The metal pads may electrically float inside the mounting substrate 16, or be connected with inner patterns formed in the mounting substrate 16.

The heat on the resin-sealed type semiconductor device 103 is transmitted to the conductive layers 10*a* and 10*b* by the Peltier element constructed from the electrode pads 6*a* and 6*b*, the conductive layers 9, 10*a*, and 10*b*, the n-type semiconductor 11, the p-type semiconductor 12, and the spherical electrodes 14*a* and 14*b*, and through the electrode pads 6*a* and 6*b*, and the spherical electrodes 14*a* and 14*b*, finally reaching the mounting substrate 16 where it is radiated. At the same time, the heat transmitted to the conductive layers 10*a* and 10*b* also reaches the mounting substrate 16 through the radiating materials 19*a* and 19*b*, and the metal pads, and radiated wherefrom.

Manufacturing Method

Next, a method of manufacturing the resin-sealed type semiconductor device 103 according to the fourth embodiment of the present invention will be explained.

In the method of manufacturing the resin-sealed type semiconductor device 104, the process of forming the spherical electrodes 13, 14*a*, and 14*b* up to the process of preparing the semiconductor wafer 1' whose electrical property has been estimated by wafer inspection are the same as the processes shown in FIGS. 4A to 6A with respect to the first embodiment of the present invention. Furthermore, in the fifth embodiment, processes of forming the radiating material 20 on the conductive layers 10*a* and 10*b* are added after the process of forming the spherical electrodes 13, 14*a*, and 14*b* shown in FIG. 6A.

Referring to FIG. 11B, in forming the radiating material 20, a liquid ceramic is applied on the conductive layers 10*a* and 110*b*, and the liquid ceramic is hardened, for example, by a heat treatment at 50 degrees C. for 36 Hr. At this time, it is possible to use a spray to apply the liquid ceramic. In addition, the liquid ceramic can be brought up to the height of the spherical electrodes 13, 14*a*, and 14*b* by its viscosity, but according to need, it is also possible to form a barrier such as a mask in order to control the height of the liquid ceramic. After the formation of the radiating material 20, as shown in FIG. 6B, the semiconductor wafer 1' is divided into pieces, and the formation of the resin-sealed type semiconductor device 104 is completed.

Operation Effect

According to the semiconductor device of the fifth embodiment of the present invention, by integrating the Peltier element inside the resin-sealed type semiconductor device 104, miniaturization of a package can be realized. In addition, the components constituting the Peltier element which are arranged closely, and this allows the Peltier element to demonstrate the Peltier effect to the maximum extent. Thereby, the heat radiation efficiency of the semiconductor device can be improved.

Furthermore, since ceramic has high heat conduction and high heat radiation, the heat radiation efficiency of the semiconductor device can be further improved by forming the radiating material 20 made of ceramic on the conductive layers 10*a* and 10*b*, and connecting the radiating material 20 to the mounting substrate 16.

Moreover, since the radiating material 20 is formed by applying a liquid ceramic, it can be formed in any desired region at any desired range. Therefore, improved flexibility in the design of the cooling structure can be achieved. Moreover, since the liquid ceramic can be applied by using a spray or the like, the process of forming the radiating material 20 can be done simply. Therefore, operating efficiency can be improved.

Moreover, almost the entire manufacturing process including the formation of the Peltier element and the radiating material 20 can be carried out in batch processing at a wafer level, and thereby, cost reduction can also be realized.

(6) Six Embodiment

Structure

Next, a structure of a resin-sealed type semiconductor device 105 according to a sixth preferred embodiment of the present invention will be explained.

Figure 12A:
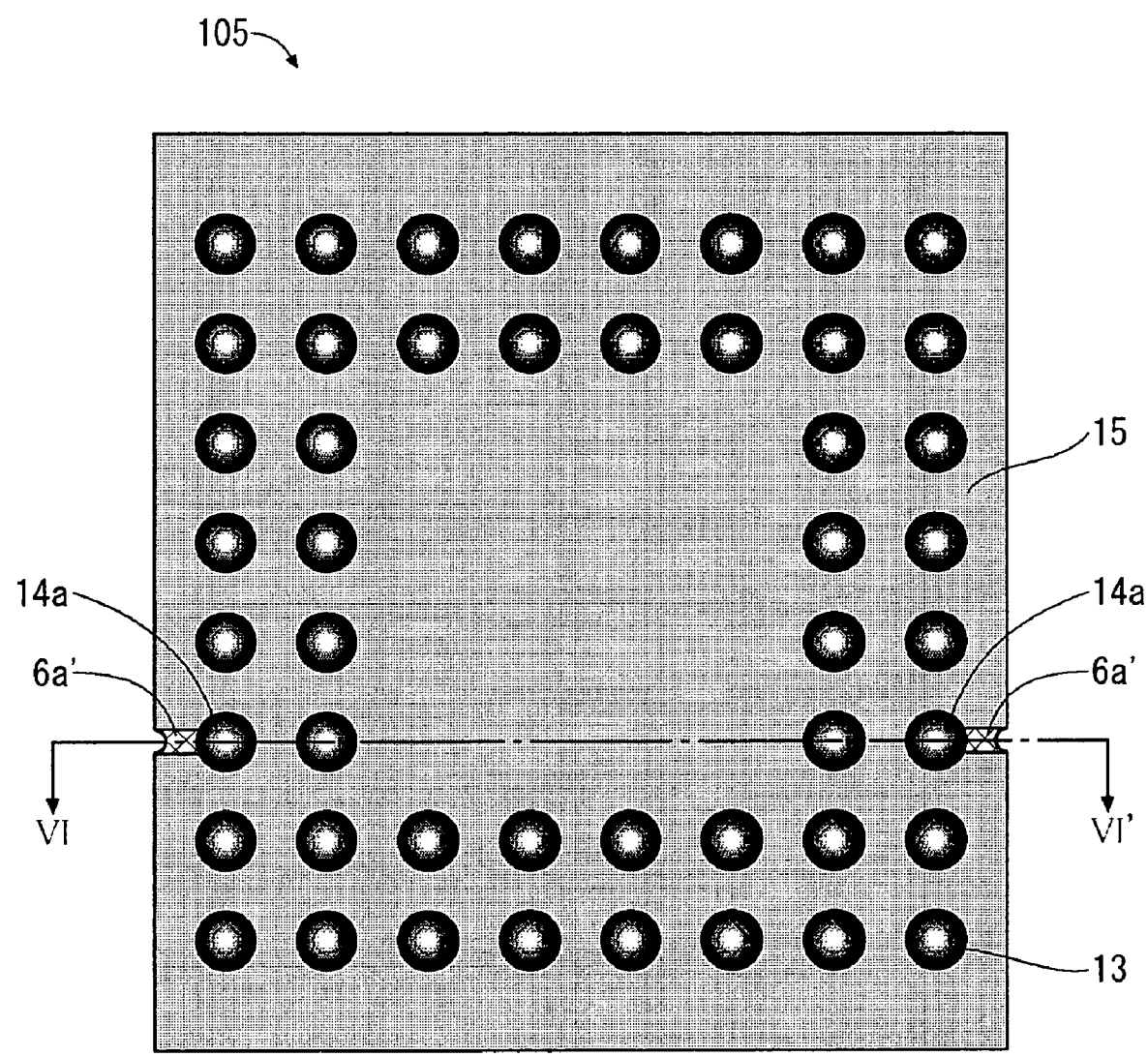
FIG. 12A is a plan view of a resin-sealed type semiconductor device according to a sixth preferred embodiment of the present invention.
Figure 12B:
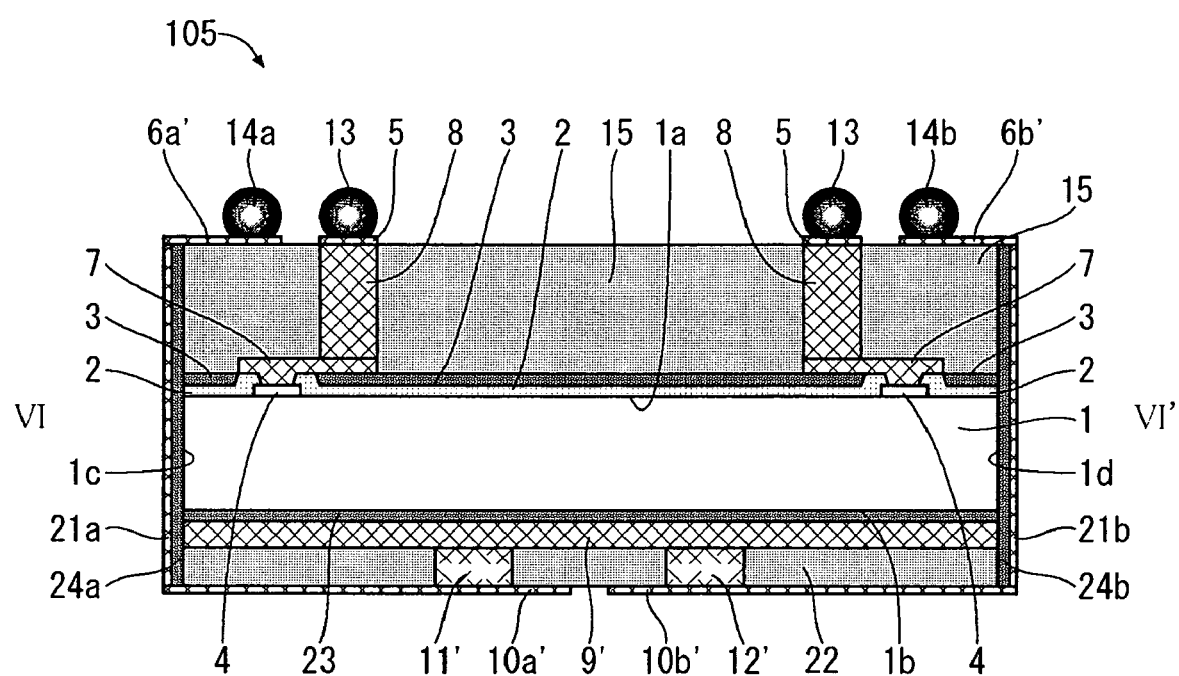
FIG. 12B is a cross-sectional diagrammatical view taken along line VI-VI' shown in FIG. 12A.

FIGS. 12A and 12B are views showing the structure of the resin-sealed type semiconductor device 105 according to the sixth embodiment of the present invention. FIG. 12A is a plan view of the resin-sealed type semiconductor device 105, and FIG. 12B is a cross-sectional diagrammatical view taken along line VI-VI' shown in FIG. 12A.

As shown in FIGS. 12A and 12B, the resin-sealed type semiconductor device 105 has the semiconductor chip 1, the protective films 2 and 3, the electrode pads 4 and 5, electrode pads 6*a*' and 6*b*' (first and second electrode pads), the re-wiring layers 7, the contact portions (i.e. posts) 8, a conductive layer 9' (a fist conductive layer), a conductive layer 10*a*' (a second conductive layer), a conductive layer 10*b*' (a third conductive layer), a conductive layer 21*a* (a fourth conductive layer), a conductive layer 21*b* (a fifth conductive layer), an n-type semiconductor 11', a p-type semiconductor 12', the spherical electrodes 13, the spherical electrodes 14*a* and 14*b*, the sealing resin 15 (a first sealing resin), a sealing resin 22 (a second sealing resin), an insulation film 23 (a first insulation film), an insulation film 24*a* (a second insulation film), and an insulation film 24*b* (a third insulation film). It should be noted that the arrangement and the number of the spherical electrodes 13, 14*a*, and 14*b* are not limited to what is shown in the plan view FIG. 12A and the cross-sectional view FIG. 12B. In addition, the protective films 2 and 3, the electrode pads 4 and 5, and re-wiring layers 7 may be included in the structure of the semiconductor chip 1.

The semiconductor chip 1 is the same as the one according to the first embodiment. In other words, the protective film 2 and the electrode pads 4 are formed on the element formation surface 1a of the semiconductor chip 1.

The protective films 3 are formed on the semiconductor chip 1 expect for the upper parts of the electrode pads 4. The protective film 3 is, for example, a polyimide resin film. The re-wiring layers 7 are electrically connected to the electrode pads 4, respectively. The contact portions 8 respectively connect the re-wiring layers 7 and the electrode pads 5, respectively. For example, the re-wiring layers 7, the contact portions 8, and the electrode pads 5 can be made of metal such as Cu and Al. The spherical electrodes 13 are formed on the electrode pads 5, and they serve as a terminal to connect the resin-sealed type semiconductor device 105 to an external apparatus such as a printed circuit board or the like. Generally, the spherical electrodes 13 are solders. The sealing resin 15 seals the protective films 3, the re-wiring layers 7, and the contact portions 8. The sealing resin 15 is, for example, a thermosetting resin such as an epoxy resin.

The insulation film 23 is made of ceramic having a function of a radiating material, and it is formed on the back or under surface (a second surface) 1b of the semiconductor chip 1. The conductive layer 9' is formed on the insulation film 23 to cover the back surface 1b of the semiconductor chip 1b. In other words, the insulation film 23 is interposed by the semiconductor chip 1 and the conductive layer 9'. For example, the conductive layer 9' is made of a metal such as Cu and Al. The semiconductor chip 1 is insulated from the conductive layer 9' by the insulation film 23. The n-type semiconductor 11' electrically connects the conductive layer 9' and the conductive layer 10a', which interposes the n-type semiconductor 11' and the sealing resin 22 with the conductive layer 9'. On the other hand, the p-type semiconductor 12' electrically connects the conductive layer 9' and the conductive layer 10b', which interposes the p-type semiconductor 12' and the sealing resin 22 with the conductive layer 9. For example, the conductive layers 10a' and 10b' are made of a metal such as Cu and Al. The sealing resin 22 seals the conductive layer 9', the n-type semiconductor 11', and the p-type semiconductor 12'. The sealing resin 22 is, for example, a thermosetting resin such as an epoxy resin.

The insulation films 24a and 24b are made of ceramic having a function of a radiating material. The insulation film 24a is formed in a part of the side surface 1c (a third surface) of the semiconductor chip 1 and parts of the side surface (this side surface may be included the third surface) of the sealing resins 15 and 22 in order to cover them. The insulation film 24b is formed on a part of the side surface 1d (a fourth surface) of the semiconductor chip 1 and parts of the side surface (this side surface may be included the fourth surface) of the sealing resins 15 and 22 in order to cover them. The conductive layer 21a is formed on the side surface of the insulation film 24a in order to cover it, and it connects the conductive layer 10a' and the electrode pad 6a. The conductive layer 21b is formed on the side surface of the insulation film 24b in order to cover it, and it connects the conductive layer 10b' and the electrode pad 6b. For example, the conductive layers 21a and 21b and the electrode pads 6a' and 6b' are made of metal such as Cu and Al. The conductive layer 21a and 21b are respectively insulated from the semiconductor chip 1 by the insulation films 24a and 24b. Likewise, the conductive layer 9' is insulated from the conductive layer 21a and 21b by the insulation film 24a and 24b. The spherical electrode 14a is formed on the electrode pad 6a, and it serves as a terminal to connect the resin-sealed type semiconductor device 105 to an external apparatus such as a printed circuit board or the like. Likewise, the spherical electrode 14b is formed on the electrode pad 6b, and is serves as a terminal to connect the resin-sealed type semiconductor device 105 to an external apparatus such as a printed circuit board or the like. Generally, the spherical electrodes 14a and 14b are made of solder.

Cooling Function

Next, a cooling function in the resin-sealed type semiconductor device 105 according to the sixth embodiment of the present invention will be explained.

The cooling function of the resin-sealed type semiconductor device 105 uses a double structure that is constructed from the Peltier element and the radiating materials.

In the resin-sealed type semiconductor device 105, the cooling effect is improved by a synergistic effect that can be acquired by an enforced cooling effect and a natural cooling effect. The enforced cooling effect can be acquired by the Peltier element constructed from the electrode pads 6a' and 6b', the conductive layer 9', 10a', 10b', 21a, and 21b, the n-type semiconductor 11', the p-type semiconductor 12', and the spherical electrodes 14a and 14b, and the natural cooling effect can be acquired by the radiating materials that are the insulation film 23, 24a, and 24b made of ceramic.

Manufacturing Method

Next, a method of manufacturing the resin-sealed type semiconductor device 105 according to the sixth embodiment of the present invention will be explained.

FIGS. 13A to 16C show the manufacturing processes of the resin-sealed type semiconductor device 105 in a simple manner. FIGS. 13A to 16C are based on the section of the position VI-VI' shown in FIG. 12B. In this particular embodiment, the method of manufacturing the resin-sealed type semiconductor device 105 uses the technique of W-CSP. According to the W-CSP, a sealing process is done at a wafer level. Accordingly, the processes as shown in FIGS. 13A to 16C are done at a wafer level.

Figure 13A:
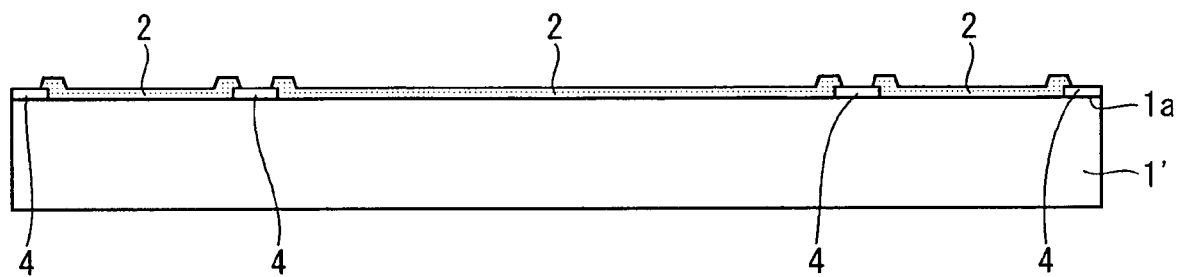
FIGS. 13A to 16C show manufacturing processes of the resin-sealed type semiconductor device according to the sixth embodiment of the present invention.

First, as shown in FIG. 13A, a semiconductor wafer 1' whose electrical property has been estimated by wafer inspection is prepared. The semiconductor wafer 1' has the protective film 2 and the electrode pads 4 on the side or top of the element formation surface 1a. On the element formation surface 1a, an electronic circuitry (not shown) is constituted by semiconductor elements such as a transistor, and the electrode pads 4 are electrically connected to those semiconductor elements. The protective film 2 is formed on the semiconductor wafer 1' except for the upper parts of the electrode pads 4. Generally, the protective film 2 is a silicone oxide film ($SiO_2$), but it can also be a silicone nitride film ($Si_3N_4$).

Figure 13B:
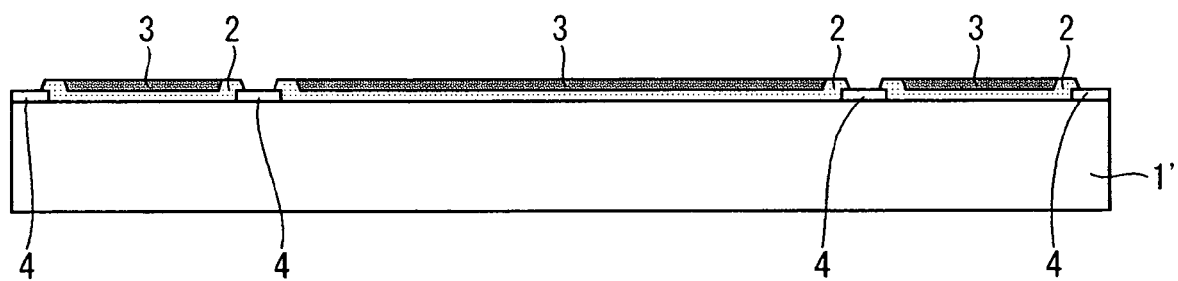

Next, as shown in FIG. 13B, a polyimide resin is applied over the whole surface of the semiconductor wafer 1', and the protective film 3 is formed except for the upper parts of the electrode pads 4 by photolithography and etching.

Figure 13C:
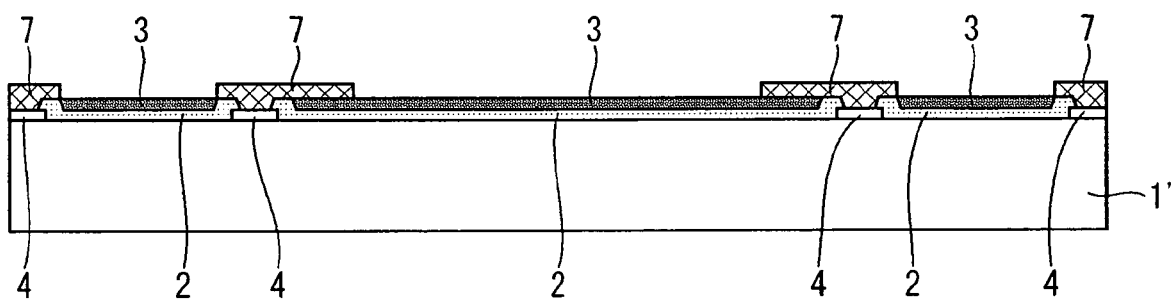

Next, as shown in FIG. 13C, Cu is deposited on the whole surface of the semiconductor wafer 1' by sputtering, and through photolithography and etching, the re-wiring layers 7 and the conductive layer 9' are formed. The re-wiring layers 7 are formed so that they connect with the electrode pads 4. As for the material of the re-wiring layers 7, it is also possible to use Al or the like instead of Cu.

Figure 13D:
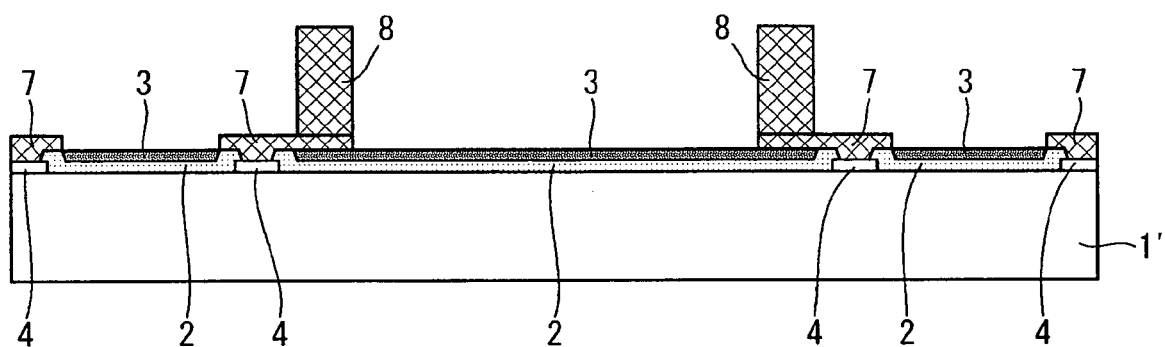

Next, as shown in FIG. 13D, the contact portions 8 made of Cu are formed at parts of the re-wiring layers 7 by electroplating. In this process, for instance, a resist medium is applied over the whole surface of the semiconductor wafer 1', and through processes of exposure and development, a resist having apertures which expose parts of the re-wiring layers 7 is formed. Then, through the process of soaking the semiconductor wafer 1' in a coating liquid including Cu, the apertures are filled up with the coating liquid. After the coating liquid is hardened, the resist is removed so that the contact portions 8 respectively are formed on the re-wiring layers 7. As for the material of the contact portion 8, it is also possible to use Al or the like instead of Cu.

Figure 14A:
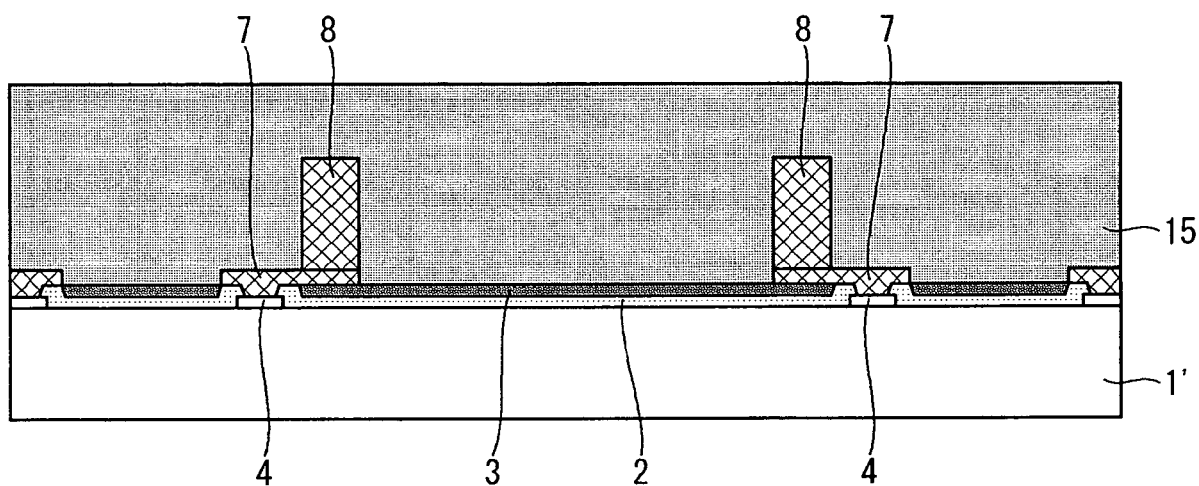

Next, as shown in FIG. 14A, the sealing resin 15 such as an epoxy resin is formed so that it seals the protective films 3, the re-wiring layers 7, and the contact portions 8.

Figure 14B:
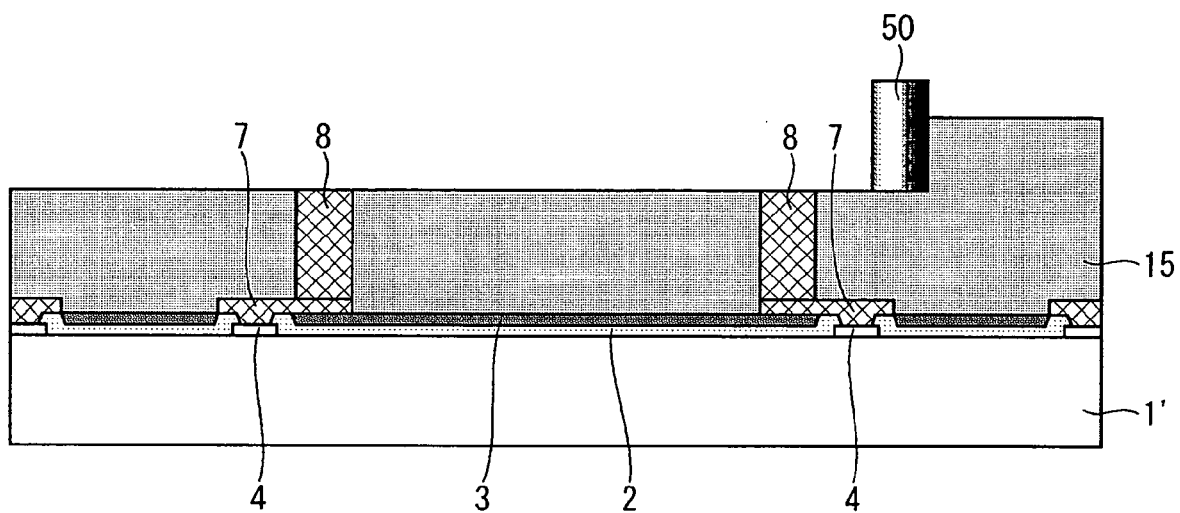

Next, as shown in FIG. 14B, the whole surface of the sealing resin 15 is etched (grinded). Consequently, the surfaces of the contact portions 8 are exposed.

Figure 14C:
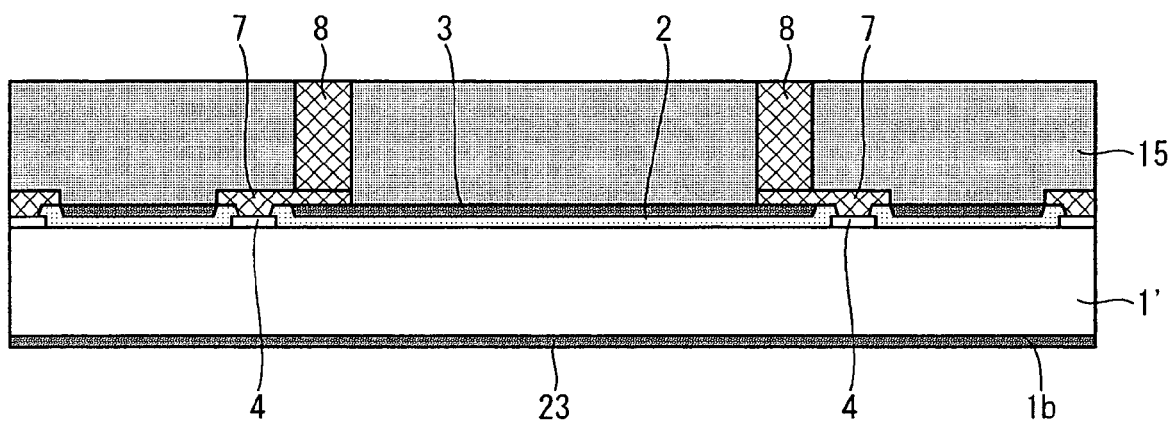

Next, as shown in FIG. 14C, the insulation film 23 made of ceramic is formed on the back surface 1b of the semiconductor wafer 1'. In forming the insulation film 24, a liquid ceramic is applied on the back surface 1b of the semiconductor wafer 1', and the liquid ceramic is hardened, for example, by a heat treatment at 50 degrees C. for 36 Hr. At this time, it is possible to use a spray to apply the liquid ceramic.

Figure 14D:
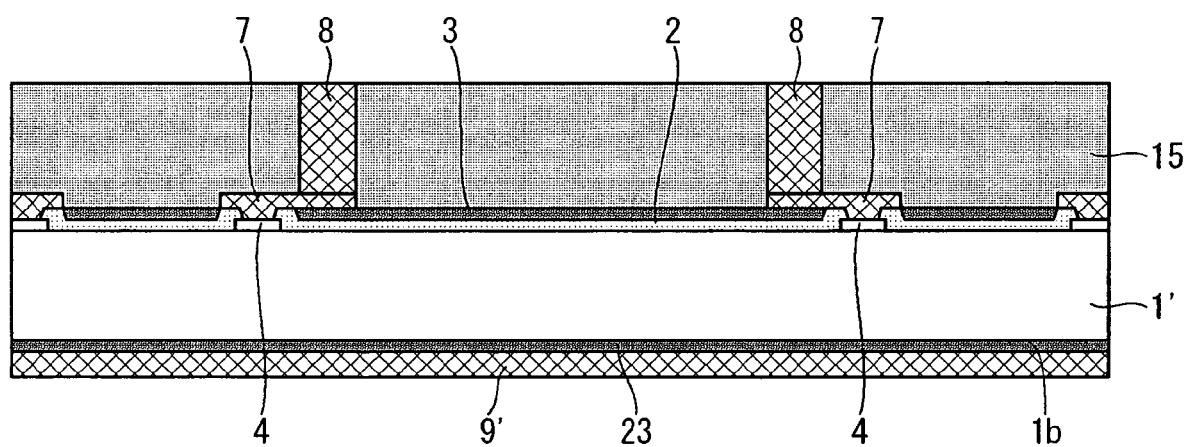

Next, as shown in FIG. 14D, Cu is deposited on the insulation film 23 by sputtering, and the conductive layer 9' made of Cu is formed. As for the material of the conductive layer 9', it is also possible to use Al or the like, instead of Cu.

Figure 15A:
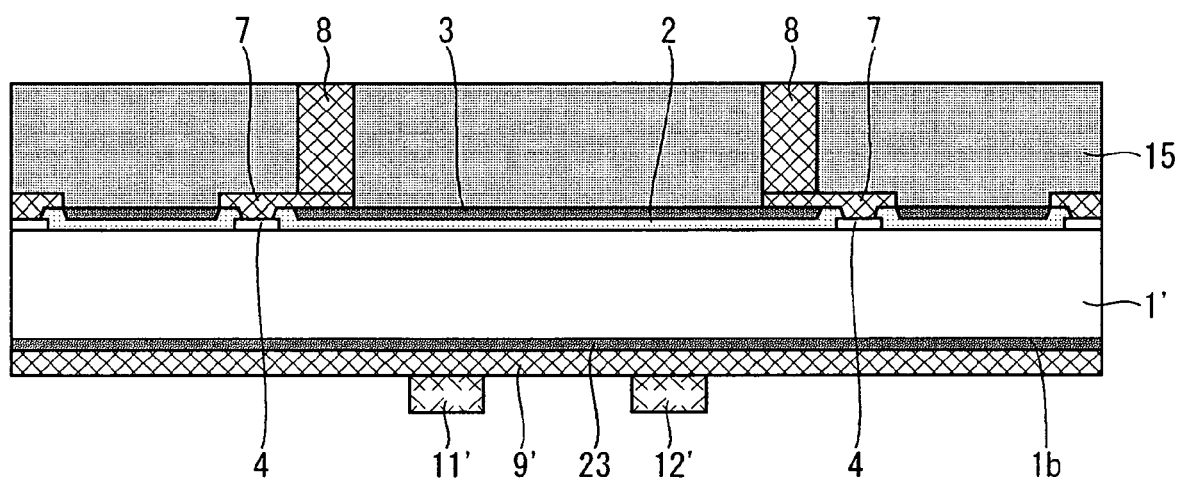

Next, as shown in FIG. 15A, the n-type semiconductor 11' and the p-type semiconductor 12' are formed on the conductive layer 9'. For example, the n-type semiconductor 11' can be formed by cutting off a piece of an n-type semiconductor substrate and attaching it on the conductive layer 9' using an epoxy adhesive. Likewise, for example, the p-type semiconductor 12' can be formed by cutting off a piece of a p-type semiconductor substrate and attaching it on the conductive layer 9' using the epoxy adhesive.

Figure 15B:
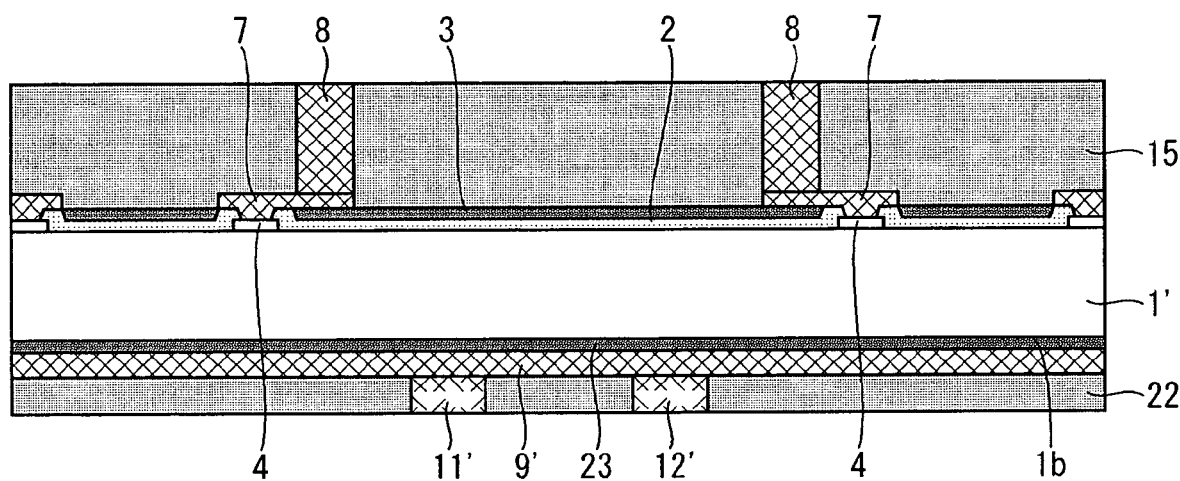

Next, as shown in FIG. 15B, the conductive layer 9', the n-type semiconductor 11', and the p-type semiconductor 12' are sealed by the sealing resin 22. Here, the sealing resin 22, for example, can be an epoxy resin or the like.

Figure 15C:
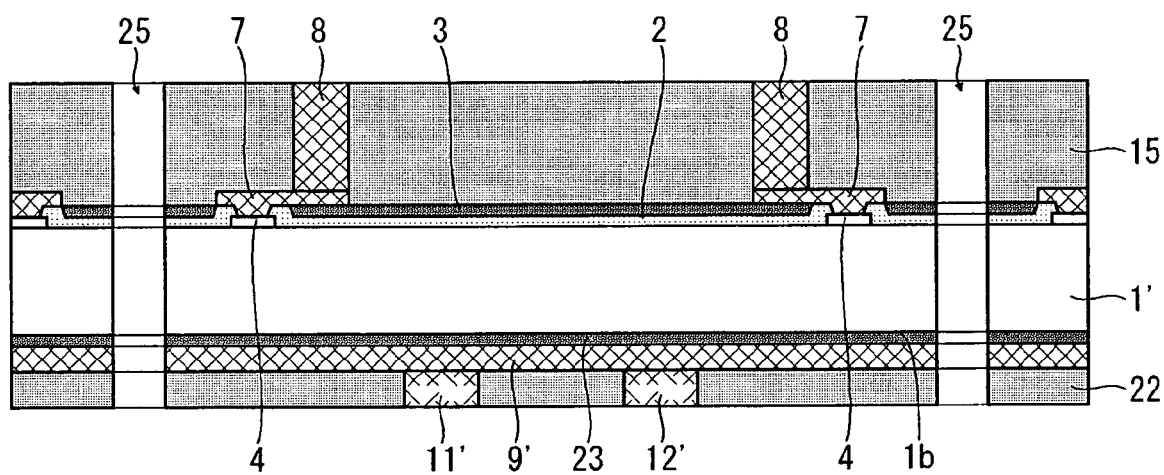

Next, as shown in FIG. 15C, through holes 25 (which include first and second through holes) are formed at scribe regions which are reference regions in the later dividing (dicing) process. For example, the through holes 25 are formed by plasma etching and laser cutting or the like. The diameter of the through holes 25 is preferably, for example, 100 μm, and at least two of the through holes 25 are formed at the scribe regions. In this particular embodiment, each of the scribe regions constituting a pair has one through hole 25.

Figure 15D:
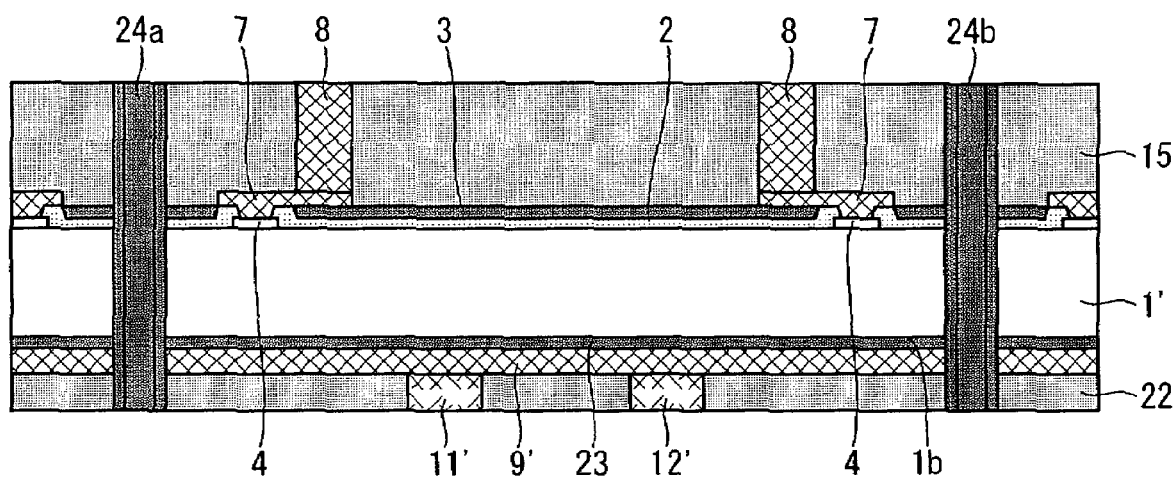

Next, as shown in FIG. 15D, the insulation films 24a and 24b made of ceramic are formed on the inner wall of the through holes 25. In forming the insulation films 24a and 24b, a liquid ceramic is filled in the through holes 25, and the liquid ceramic is hardened, for example, by a heat treatment at 50 degrees C. for 36 Hr. In addition, it is possible to fill the liquid ceramic in the through holes 25 by the capillary phenomenon, but according to need, it is also possible to pressure form by vacuuming and so on.

Figure 16A:
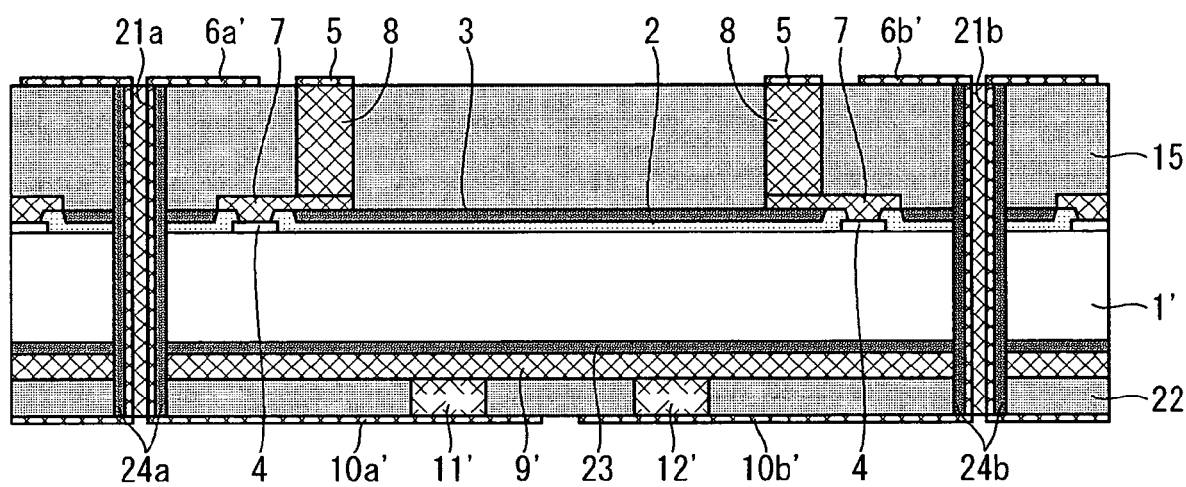

Next, as shown in FIG. 16A, Cu is deposited on the sealing resin 15 by sputtering, and through photolithography and etching, the electrode pads 5 are formed on the contact portions 8. At the same time, the conductive layer 6a' is formed on the sealing resin 15. Next, Cu is deposited on the sealing resin 22 by sputtering, and through photolithography and etching, the conductive layers 10a' and 10b' are formed.

Next, the conductive layers 21a and 21b are formed on the inner wall of the through holes 25. In forming the conductive layers 21a and 21b, electrolytic plating of Cu can be applied with an usual process of forming through holes. By this process, the conductive layer 21a is connected with the conductive layer 10a' and the electrode pad 6a, and the conductive layer 21b is connected with the conductive layer 10b' and the electrode pad 6b. As for the material of the electrode pads 6a' and 6b, the conductive layers 10a' and 10b', and the conductive layers 21a and 21b, it is also possible to use Al or the like instead of Cu.

Figure 16B:
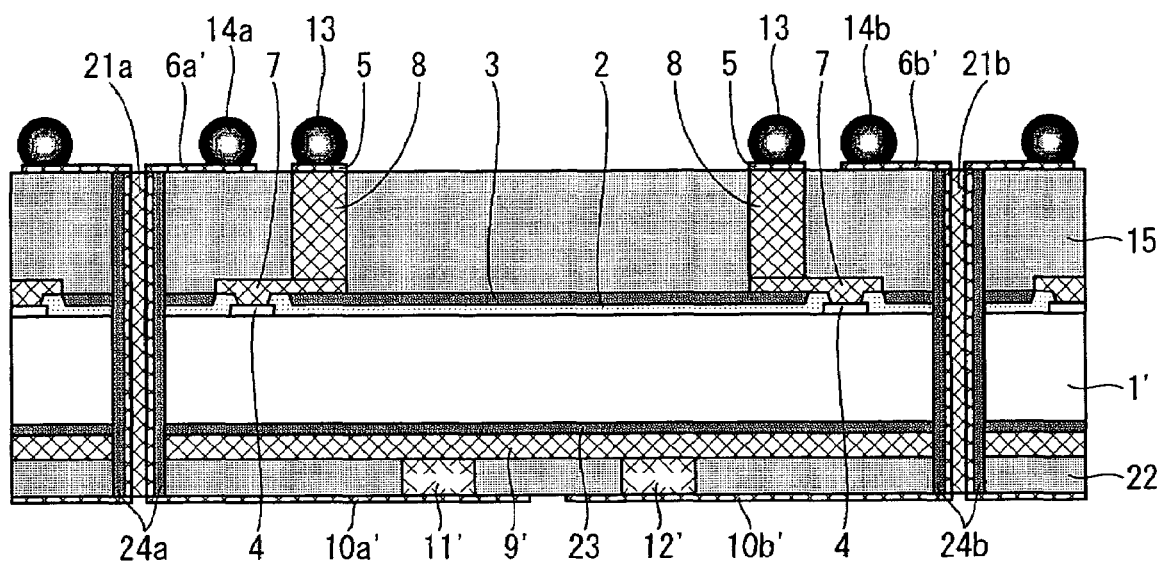

Next, as shown in FIG. 16B, the spherical electrodes 13 made of solder are formed on the electrode pads 5. Furthermore, the spherical electrode 14a made of solder is formed on the electrode pad 6a, and the spherical electrode 14b made of the solder is formed on the electrode pad 6b. The spherical electrodes 13, 14a, and 14b are, for example, formed by ball mounting.

Figure 16C:
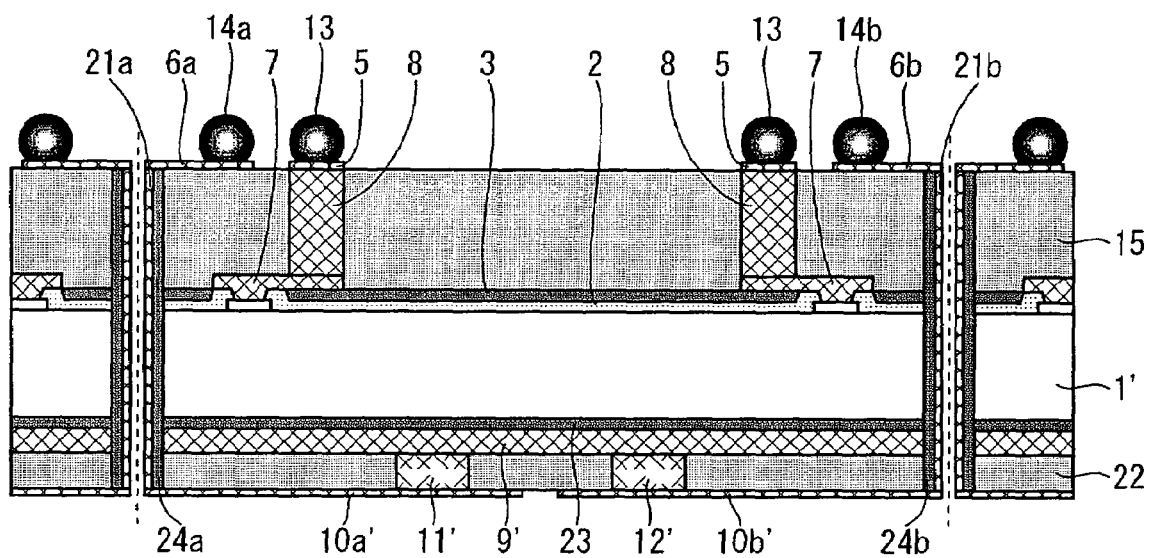

Finally, as shown in FIG. 16C, the semiconductor wafer 1' is divided into pieces, and the formation of the resin-sealed type semiconductor device 105 is completed.

Operation Effect

According to the semiconductor device of the sixth embodiment of the present invention, by integrating the Peltier element inside the resin-sealed type semiconductor device 105, miniaturization of a package can be realized. In addition, the components constituting the Peltier element are arrenged relatively closely, and this allows the Peltier element to demonstrate the Peltier effect to the maximum extent. Thereby, the heat radiation efficiency of the semiconductor device can be improved.

Furthermore, the Peltier element formed on the back surface 1b of the semiconductor chip 1 allows the formation of the conductive layers 9', 10a', and 10b' in wide regions. Thereby, the area for heat absorption (i.e. the conductive layer 9') and the area for heat radiation (i.e. the conductive layer 10a' and 10b') increases, and heat radiation efficiency of the semiconductor device can be improved.

Moreover, since ceramic has high heat conduction and high heat radiation, the heat radiation efficiency of the semiconductor device can be further improved by forming the insulation film 23, 24a, and 24b made of ceramic.

Moreover, almost the entire manufacturing process including the formation of the Peltier element and the insulation film 23, 24a, and 24b can be carried out in batch processing at a wafer level, thereby cost reduction can also be realized.

(7) Seventh Embodiment

Structure

Next, a structure of a resin-sealed type semiconductor device 106 according to a seventh preferred embodiment of the present invention will be explained.

Figure 17A:
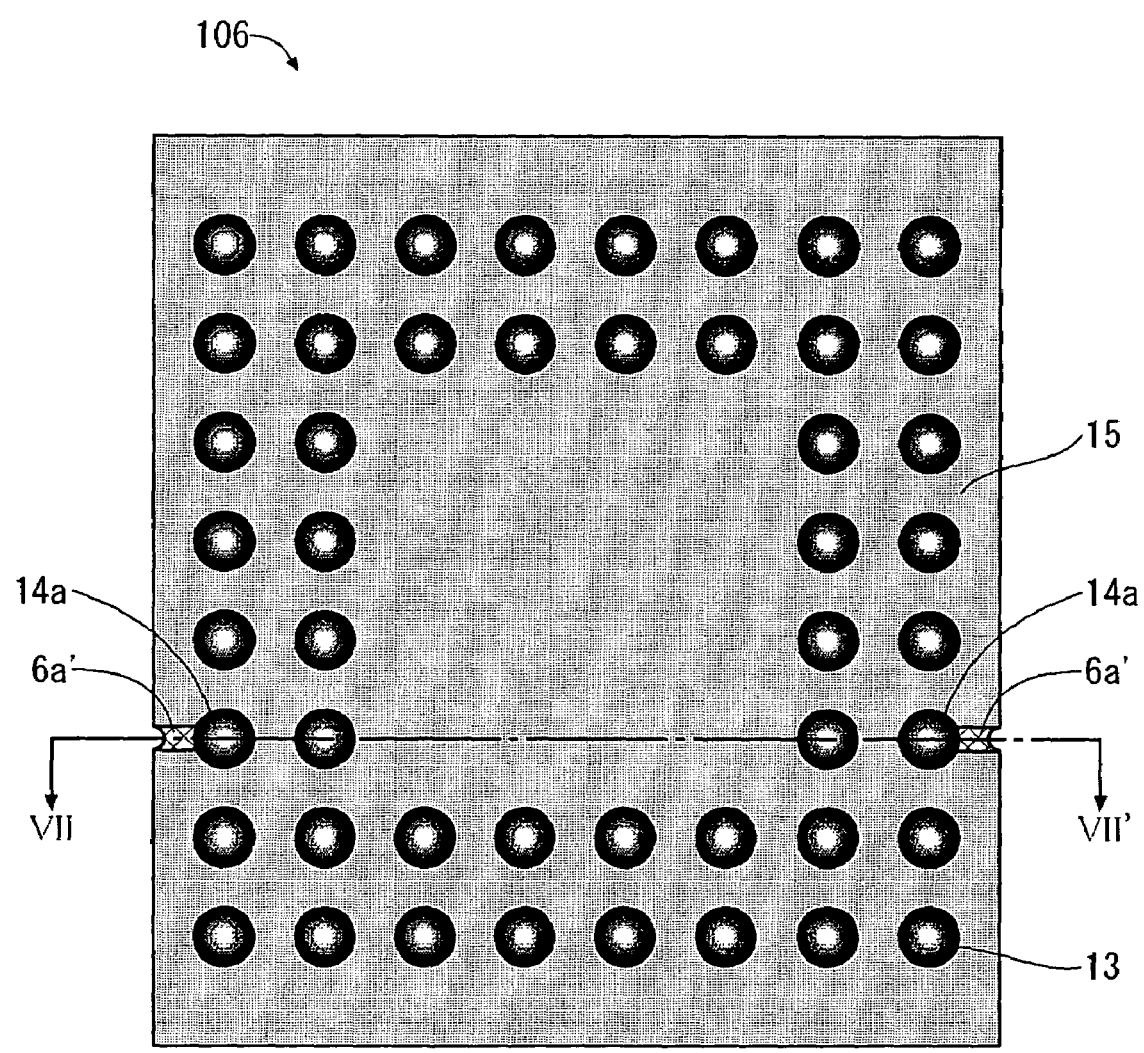
FIG. 17A is a plan view of a resin-sealed type semiconductor device according to a seventh preferred embodiment of the present invention.
Figure 17B:
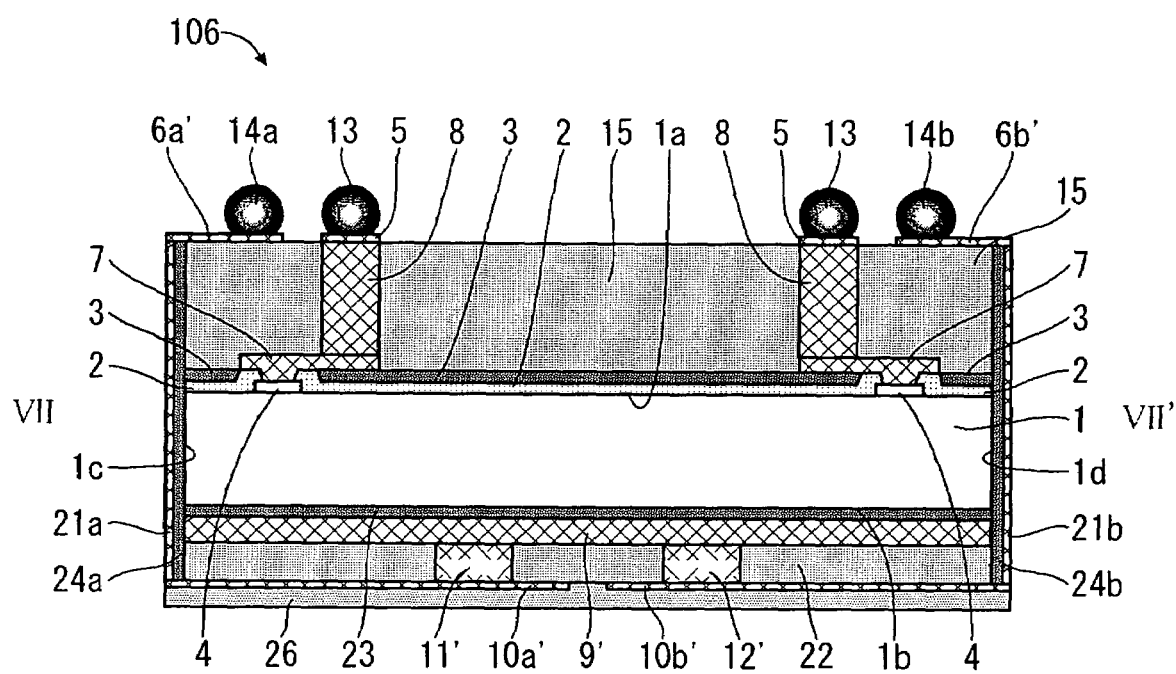
FIG. 17B is a cross-sectional diagrammatical view taken along line VII-VII' shown in FIG. 17A.

FIGS. 17A and 17B are views showing the structure of the resin-sealed type semiconductor device 106 according to the seventh embodiment of the present invention. FIG. 17A is a plan view of the resin-sealed type semiconductor device 106, and FIG. 17B is a cross-sectional diagram taken along line VII-VII' shown in FIG. 17A.

As shown in FIGS. 17A and 17B, the resin-sealed type semiconductor device 106 has the same or similar structure as the resin-sealed type semiconductor device 105 according to the sixth embodiment, but further has a radiating material 26 on the conductive layers 10a' and 10b' as the primary distinguishing feature. The radiating material 26 is a liquid ceramic that has been hardened. In FIGS. 17A and 17B, as for the structure elements of the resin-sealed type semiconductor device 106 that are the same as those of the resin-sealed type semiconductor device 105 according to the sixth embodiment, the same reference numbers used in FIGS. 12A an 12B are to be used and redundant description on the same structure will be omitted.

Cooling Function

Next, a cooling function in the resin-sealed type semiconductor device 106 according to the seventh embodiment of the present invention will be explained.

The cooling function of the resin-sealed type semiconductor device 106 uses a double structure which is constructed from the Peltier element and the radiating materials.

In the resin-sealed type semiconductor device 106, the cooling effect is improved by a synergistic effect that can be acquired by an enforced cooling effect and a natural cooling effect. The enforced cooling effect can be acquired by the Peltier element constructed from the electrode pads 6a' and 6b', the conductive layers 9', 10a' and 10b', the conductive layers 21a and 21b, the n-type semiconductor 11', the p-type semiconductor 12', and the spherical electrodes 14a and 14b, and the natural cooling effect can be acquired by the insulation film 23, 24a and 24b made of ceramic, and the radiating material 26 made of ceramic.

Manufacturing Method

Next, a method of manufacturing the resin-sealed type semiconductor device 106 according to the seventh embodiment of the present invention will be explained.

In the method of manufacturing the resin-sealed type semiconductor device 106, the process of forming the electrode pads 6a' and 6b', the conductive layer 10a' and 10b', and the conductive layer 21a and 21b up to the process of preparing the semiconductor wafer 1' whose electrical property has been estimated by wafer inspection are the same as the processes shown in FIGS. 13A to 16A with respect to the sixth embodiment of the present invention. Furthermore, in the seventh embodiment, a process of forming the radiating material 26 on the conductive layers 10a' and 10b' is added after the process of forming the electrode pads 6a' and 6b', the conductive layer 10a' and 10b', and the conductive layer 21a and 21b (shown in FIG. 16A).

In forming the radiating material 26 shown in 17B, a liquid ceramic is applied on the conductive layers 10a' and 10b', and the liquid ceramic is hardened, for example, by a heat treatment at 50 degrees C. for 36 Hr. At this time, it is possible to use a spray to apply the liquid ceramic. After the formation of the radiating material 26, as shown in FIG. 16B, the spherical electrodes 13 made of solder are formed on the electrode pads 5. Furthermore, the spherical electrode 14a made of solder is formed on the electrode pad 6a', and the spherical electrode 14b made of solder is formed on the electrode pad 6b'. The spherical electrodes 13, 14a, and 14b are, for example, formed by ball mounting.

Finally, as shown in FIG. 16C, the semiconductor wafer 1' is divided into pieces, and the formation of the resin-sealed type semiconductor device 106 is completed.

Operation Effect

According to the semiconductor device of the third embodiment of the present invention, by integrating the Peltier element inside the resin-sealed type semiconductor device 106, miniaturization of a package can be realized. In addition, the components constituting the Peltier element are arranged closely, and this allows the Peltier element to demonstrate the Peltier effect to the maximum extent. Thereby, the heat radiation efficiency of the semiconductor can be improved.

Furthermore, the Peltier element formed on the back surface 1b of the semiconductor chip 1 allows to form the conductive layers 9', 10a', and 10b' in wide regions. Thereby, the area for heat absorption (i.e. the conductive layer 9') and the area for heat radiation (i.e. the conductive layer 10a' and 10b') increases, and heat radiation efficiency of the semiconductor device can be improved.

Moreover, since ceramic has high heat conduction and high heat radiation, the heat radiation efficiency of the semiconductor device can be further improved by forming the radiating material 26 made of ceramic on the conductive layers 10a' and 10b', which is a cooling portion, in addition to the insulation film 23, 24a, and 24b made of ceramic.

Moreover, almost the entire manufacturing process including the formation of the Peltier element, the insulation film 23, 24a and 24b, and the radiating material 26 can be carried out in batch processing at a wafer level, thereby cost reduction can also be realized.

(8) Eighth Embodiment

Structure

Next, a structure of a resin-sealed type semiconductor device 107 according to an eighth preferred embodiment of the present invention will be explained.

Figure 18A:
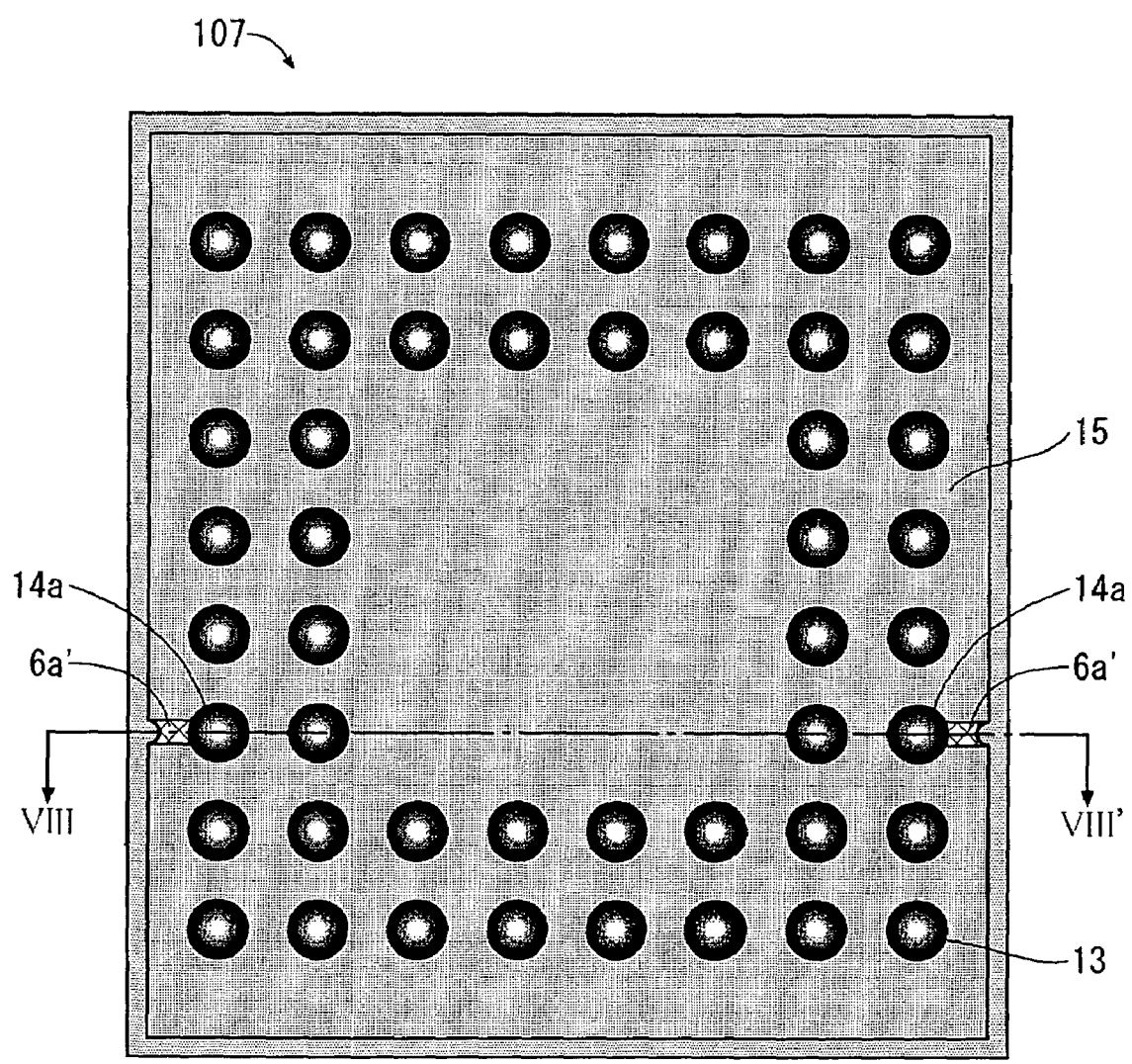
FIG. 18A is a plan view of a resin-sealed type semiconductor device according to an eighth embodiment of the present invention.
Figure 18B:
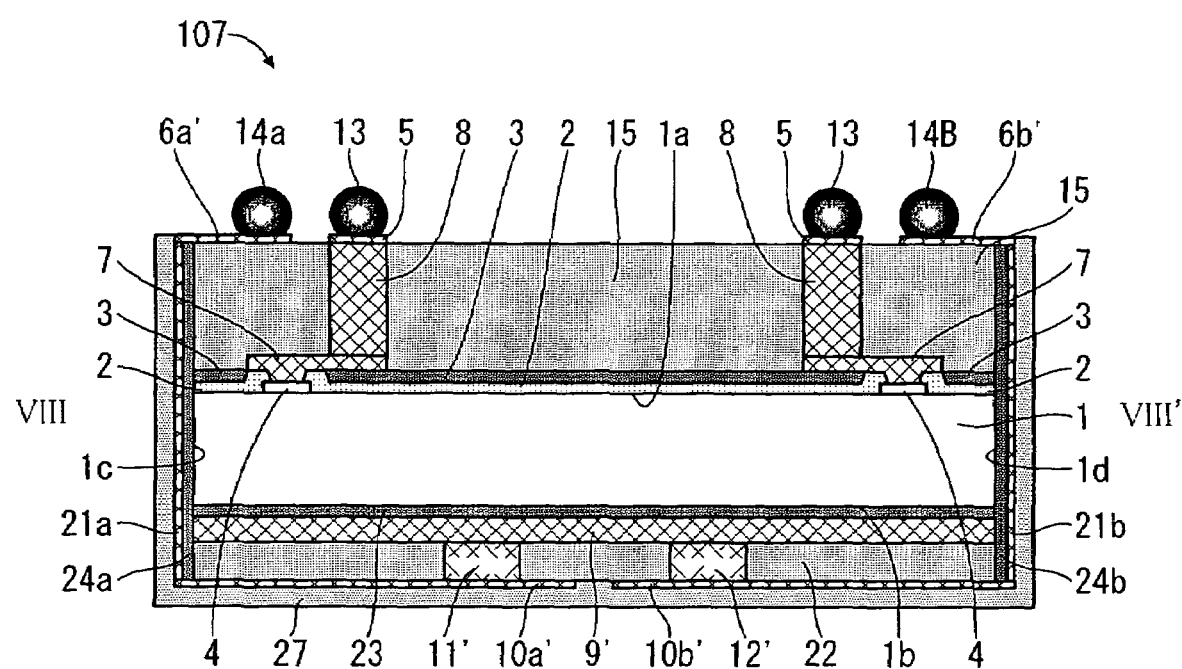
FIG. 18B is a cross-sectional diagrammatical view taken along line VIII-VIII' shown in FIG. 18A.

FIGS. 18A and 18B are views showing the structure of the resin-sealed type semiconductor device 107 according to the eighth embodiment of the present invention. FIG. 18A is a plan view of the resin-sealed type semiconductor device 107, and FIG. 18B is a cross-sectional diagram taken along line VIII-VIII' shown in FIG. 18A.

As shown in FIGS. 18A and 18B, the resin-sealed type semiconductor device 107 has the same or similar structure as that of the resin-sealed type semiconductor device 105 according to the sixth embodiment, but further has a radiating material 27 on the conductive layers 10a' and 10b', and the conductive layers 21a and 21b as the primary distinguishing feature. The radiating material 27 is a liquid ceramic that has been hardened. In FIGS. 18A and 18B, as for the structure elements of the resin-sealed type semiconductor device 107 that are the same as those of the resin-sealed type semiconductor device 105 according to the sixth embodiment, the same reference numbers used in FIGS. 12A an 12B are to be used and redundant description on the same structure will be omitted.

Cooling Function

Next, a cooling function in the resin-sealed type semiconductor device 107 according to the eighth embodiment of the present invention will be explained.

The cooling function of the resin-sealed type semiconductor device 106 uses a double structure which is constructed from the Peltier element and the radiating materials.

In the resin-sealed type semiconductor device 107, the cooling effect is improved by a synergistic effect that can be acquired by an enforced cooling effect and a natural cooling effect. The enforced cooling effect can be acquired by the Peltier element constructed from the electrode pads 6a' and 6b', the conductive layers 9', 10a' and 10b', the conductive layers 21a and 21b, the n-type semiconductor 11', the p-type semiconductor 12', and the spherical electrodes 14a and 14b, and the natural cooling effect can be acquired by the insulation film 23, 24a and 24b made of ceramic, and the radiating material 27 made of ceramic.

Manufacturing Method

Next, a method of manufacturing the resin-sealed type semiconductor device 107 according to the eighth embodiment of the present invention will be explained.

In the method of manufacturing the resin-sealed type semiconductor device 107, the process of forming the electrode pads 6a' and 6b', the conductive layer 10a' and 10b', and the conductive layer 21a and 21b up to the process of preparing the semiconductor wafer 1' whose electrical property has been estimated by wafer inspection are the same as the processes shown in FIGS. 13A to 16A with respect to the sixth embodiment of the present invention. Furthermore, in the eighth embodiment, a process of forming the radiating material 27 on the conductive layers 10a' and 10b', and the conductive layers 21a and 21b is added after the process of forming the electrode pads 6a' and 6b', the conductive layer 10a' and 10b', and the conductive layer 21a and 21b (shown in FIG. 16A).

Referring to FIG. 18B, in forming the radiating material 27, a liquid ceramic is applied on the conductive layers 10a' and 10b', and it is also filled in the through holes 25, and then the liquid ceramic is hardened, for example, by a heat treatment at 50 degrees C. for 36 Hr. In addition, it is possible to fill the liquid ceramic in the through holes 25 by the capillary phenomenon, but according to need, it is also possible to pressure form by vacuuming and so on. Furthermore, in forming the through holes 25 (shown in FIG. 15C), by expanding the diameter of the through holes 25, the liquid ceramic can flow into the through holes 25 more easily. In this case, the diameter of the through holes 25 is preferably set from 100 µm to 150 µm.

After the formation of the radiating material 27, as shown in FIG. 16B, the spherical electrodes 13 made of solder are formed on the electrode pads 5. Furthermore, the spherical electrode 14a made of solder is formed on the electrode pad 6a', and the spherical electrode 14b made of solder is formed on the electrode pad 6b'. The spherical electrodes 13, 14a and 14b are, for example, formed by ball mounting.

Finally, as shown in FIG. 16C, the semiconductor wafer 1' is divided into pieces, and the formation of the resin-sealed type semiconductor device 107 is completed.

Operation Effect

According to the semiconductor device of the third embodiment of the present invention, by integrating the Peltier element inside the resin-sealed type semiconductor device 107, miniaturization of a package can be realized. In addition, the components constituting the Peltier element are arranged closely, and this allows the Peltier element to demonstrate the Peltier effect to the maximum extent. Thereby, the heat radiation efficiency of the semiconductor can be improved.

Furthermore, the Peltier element formed on the back surface 1b of the semiconductor chip 1 allows to form the conductive layer 9', 10a', and 10b' in wide regions. Thereby, the area for heat absorption (i.e. the conductive layer 9') and the area for heat radiation (i.e. the conductive layer 10a' and 10b') increases, and heat radiation efficiency of the semiconductor device can be improved.

Moreover, since ceramic has high heat conduction and high heat radiation, the heat radiation efficiency of the semiconductor device can be further improved by forming the radiating material 27 made of ceramic on the conductive layers 10a' and 10b', which is a cooling portion, in addition to the insulation film 23, 24a, and 24b made of ceramic.

Moreover, almost the entire manufacturing process including the formation of the Peltier element, the insulation film 23, 24a and 24b, and the radiating material 27 can be carried out in batch processing at a wafer level, thereby cost reduction can also be realized possible.

This application claims priority to Japanese Patent Application No. 2004-205692. The entire disclosure of Japanese Patent Application No. 2004-205692 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor device comprising:
   a semiconductor chip having first and second surfaces;
   a sealing resin being formed over said first surface; and
   a cooling structure having
      a first conductive layer being formed on said first surface,
      an n-type semiconductor being formed on said first conductive layer and having an exposed n-type semiconductor end being exposed from said sealing resin,
      a p-type semiconductor being formed on said first conductive layer and having an exposed p-type semiconductor end being exposed from said sealing resin,
      a second conductive layer contacting said exposed n-type semiconductor end,
      a third conductive layer contacting said exposed p-type semiconductor end,
      a first electrode pad being integrally formed with said second conductive layer,
      a second electrode pad being integrally formed with said third conductive layer, and
      spherical electrodes being formed on said first and second electrode pads.

2. The semiconductor device according to claim 1, further comprising,
   a radiating material formed on said second and third conductive layers.

3. The semiconductor device according to claim 2, wherein
   said radiating material includes a ceramic.

4. The semiconductor device according to claim 2, wherein
   said radiating material is formed by a liquid ceramic.

5. The semiconductor device according to claim 2, wherein
   the height of said radiating material is approximately the same as the height of said spherical electrodes.

6. The semiconductor device according to claim 5, wherein said radiating material is formed by a liquid ceramic.

7. The semiconductor device according to claim 5, wherein said radiating material includes a metal.

8. The semiconductor device according to claim 7, wherein said radiating material includes copper.

9. The semiconductor device according to claim 1, wherein said sealing resin includes an epoxy resin.

10. The semiconductor device according to claim 1, wherein said first conductive layer includes a metal.

11. The semiconductor device according to claim 1, wherein said first conductive layer includes copper.

12. The semiconductor device according to claim 1, wherein said second conductive layer, said third conductive layer, said first electrode pad, and said second electrode pad include a metal.

13. The semiconductor device according to claim 1, wherein said second conductive layer, said third conductive layer, the first electrode pad, and said second electrode pad include copper.

14. The semiconductor device according to claim 1, wherein said spherical electrodes include a solder.

15. A semiconductor device comprising:

a semiconductor chip having first and second surfaces facing each other, and third and fourth surfaces facing each other and adjoining said first and second surfaces;

a first sealing resin being formed over said first surface;

a second sealing resin being formed over said second surface;

a first insulation film being formed on said second surface;

a second insulation film being formed on said third surface;

a third insulation film being formed on said fourth surface;

a cooling structure having a first conductive layer being formed on said first insulation film, an n-type semiconductor being formed on said first conductive layer and having an exposed n-type semiconductor end being exposed from said second sealing resin, a p-type semiconductor being formed on said first conductive layer and having an exposed p-type semiconductor end being exposed from said second sealing resin, a second conductive layer contacting said exposed n-type semiconductor end, a third conductive layer contacting said exposed p-type semiconductor end, first and second electrode pads being formed on said first sealing resin, a fourth conductive layer being formed on said second insulation film and electrically connecting said second conductive layer and said first electrode pad, a fifth conductive layer being formed on said third insulation film and electrically connecting said third conductive layer and said second electrode pad, and spherical electrodes being formed on said first and second electrode pads.

16. The semiconductor device according to claim 15, further comprising, a first radiating material formed on said second and third conductive layers.

17. The semiconductor device according to claim 15, wherein a first radiating material is formed by a liquid ceramic.

18. The semiconductor device according to claim 16, further comprising, a second radiating material formed on said fourth and fifth conductive layers.

19. The semiconductor device according to claim 18, wherein said first and second radiating materials are formed by a liquid ceramic.

20. The semiconductor device according to claim 15, wherein said first and second sealing resins include an epoxy resin.

21. The semiconductor device according to claim 15, wherein said first conductive layer includes a metal.

22. The semiconductor device according to claim 15, wherein said first conductive layer includes copper.

23. The semiconductor device according to claim 15, wherein said second conductive layer, said third conductive layer, said first electrode pad, and said second electrode pad include a metal.

24. The semiconductor device according to claim 15, wherein said second conductive layer, said third conductive layer, said first electrode pad, and said second electrode pad include copper.

25. The semiconductor device according to claim 15, wherein said first insulation film, said second insulation film, and said third insulation film are formed by a liquid ceramic.

26. The semiconductor device according to claim 15, wherein said spherical electrodes include a solder.

27. A method of manufacturing a semiconductor device comprising:

preparing a semiconductor wafer having first and second surfaces;

forming a first conductive layer on the first surface;

forming an n-type semiconductor on the first conductive layer;

forming a p-type semiconductor on the first conductive layer;

forming a sealing resin over the first surface;

exposing one end of the n-type semiconductor from the sealing resin;

exposing one end of the p-type semiconductor from the sealing resin;

forming a second conductive layer contacting the exposed end of the n-type semiconductor;

forming a third conductive layer contacting the exposed end of the p-type semiconductor;

forming a first electrode pad integrally with the second conductive layer;

forming a second electrode pad integrally with the third conductive layer; and forming spherical electrodes on the first and second electrodes.

28. The method of manufacturing a semiconductor device according to claim 27, further comprising,
forming a radiating material on the second and third conductive layers.

29. The method of manufacturing a semiconductor device according to claim 28, wherein
the radiating material includes a ceramic.

30. The method of manufacturing a semiconductor device according to claim 28, wherein
the radiating material is formed by a liquid ceramic.

31. The method of manufacturing a semiconductor device according to claim 28, wherein
the height of the radiating material is approximately the same as the height of the spherical electrode.

32. The method of manufacturing a semiconductor device according to claim 31, wherein
the radiating material is formed by a liquid ceramic.

33. The method of manufacturing a semiconductor device according to claim 31, wherein
the radiating material includes a metal.

34. The method of manufacturing a semiconductor device according to claim 31, wherein
the radiating material includes copper.

35. The method of manufacturing a semiconductor device according to claim 27, wherein
the sealing resin includes an epoxy resin.

36. The method of manufacturing a semiconductor device according to claim 27, wherein
the first conductive layer includes a metal.

37. The method of manufacturing a semiconductor device according to claim 27, wherein
the first conductive layer includes copper.

38. The method of manufacturing a semiconductor device according to claim 27, wherein
the second conductive layer, the third conductive layer, the first electrode pad, and the second electrode pad include a metal.

39. The method of manufacturing a semiconductor device according to claim 27, wherein
the second conductive layer, the third conductive layer, the first electrode pad, and the second electrode pad include copper.

40. The method of manufacturing a semiconductor device according to claim 27, wherein
the spherical electrodes include a solder.

41. A method of manufacturing a semiconductor device comprising:
preparing a semiconductor chip having first and second surfaces facing each other, and third and fourth surfaces facing each other and adjoining the first and second surfaces;
forming a first sealing resin over the first surface;
forming a first insulation film on the second surface;
forming a first conductive layer on the first insulation film;
forming an n-type semiconductor on the first conductive layer;
forming a p-type semiconductor on the first conductive layer;
forming a second sealing resin over the second surface;
exposing one end of the n-type semiconductor from the second sealing resin;
exposing one end of the p-type semiconductor from the second sealing resin;
forming first and second through holes penetrating the semiconductor chip, the first sealing resin and the second sealing resin;
forming a second insulation film on the inner wall of the first through hole;
forming a third insulation film on the inner wall of the second through hole;
forming a second conductive layer contacting the exposed end of the n-type semiconductor;
forming a third conductive layer contacting the exposed end of the p-type semiconductor;
forming first and second electrode pads on the first sealing resin;
forming a fourth conductive layer covering the surface of the second insulation film inside the first through hole, the fourth conductive layer connecting the second conductive layer and the first electrode pad;
forming a fifth conductive layer covering the surface of the third insulation film inside the second through hole, the fifth conductive layer connecting the third conductive layer and the second electrode pad; and
forming spherical electrodes at the first and second electrode pads, respectively.

42. The method of manufacturing a semiconductor device according to claim 41, further comprising,
forming a first radiating material on the second and third conductive layers.

43. The method of manufacturing a semiconductor device according to claim 42, wherein
the first radiating material is formed by a liquid ceramic.

44. The method of manufacturing a semiconductor device according to claim 42, further comprising,
forming a second radiating material on the fourth and fifth conductive layers.

45. The method of manufacturing a semiconductor device according to claim 44, wherein
the first and second radiating materials are formed by a liquid ceramic.

46. The method of manufacturing a semiconductor device according to claim 41, wherein
the first and second sealing resins include an epoxy resin.

47. The method of manufacturing a semiconductor device according to claim 41, wherein
the first conductive layer includes a metal.

48. The method of manufacturing a semiconductor device according to claim 41, wherein
the first conductive layer includes copper.

49. The method of manufacturing a semiconductor device according to claim 41, wherein
the second conductive layer, the third conductive layer, the first electrode pad, and the second electrode pad include a metal.

50. The method of manufacturing a semiconductor device according to claim 41, wherein
the second conductive layer, the third conductive layer, the first electrode pad, and the second electrode pad include copper.

51. The method of manufacturing a semiconductor device according to claim 41, wherein
the first insulation film, the second insulation film, and the third insulation film are formed by a liquid ceramic.

52. The method of manufacturing a semiconductor device according to claim 41, wherein
the spherical electrodes include a solder.

* * * * *